US008698269B2

(12) United States Patent
Hanai et al.

(10) Patent No.: US 8,698,269 B2
(45) Date of Patent: Apr. 15, 2014

(54) WIRING BOARD WITH BUILT-IN IMAGING DEVICE AND METHOD FOR MANUFACTURING SAME

(75) Inventors: Nobuhiro Hanai, Ogaki (JP); Takaya Endo, Ogaki (JP); Mitsuhiro Tomikawa, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 143 days.

(21) Appl. No.: 13/403,041

(22) Filed: Feb. 23, 2012

(65) Prior Publication Data

US 2012/0217607 A1 Aug. 30, 2012

Related U.S. Application Data

(60) Provisional application No. 61/447,195, filed on Feb. 28, 2011.

(51) Int. Cl.
*H01L 31/02* (2006.01)

(52) U.S. Cl.
USPC ............... 257/448; 257/E31.113; 438/66

(58) Field of Classification Search
USPC ........................................... 257/448
See application file for complete search history.

(56) References Cited

FOREIGN PATENT DOCUMENTS

| JP | 11-191864 | 7/1999 |
| JP | 2007-60288 | 3/2007 |

OTHER PUBLICATIONS

U.S. Appl. No. 13/357,645, filed Jan. 25, 2012, Hanai, et al.
U.S. Appl. No. 13/334,152, filed Dec. 22, 2011, Hanai, et al.

*Primary Examiner* — Zandra Smith
*Assistant Examiner* — Lawrence Tynes, Jr.
(74) *Attorney, Agent, or Firm* — Oblon, Spivak, McClelland, Maier & Neustadt, L.L.P.

(57) ABSTRACT

A wiring board with a built-in imaging element includes a substrate having an accommodation portion and a first surface and a second surface on the opposite side of the first surface, an imaging device having a light receiver and positioned in the accommodation portion of the substrate such that the light receiver faces the first surface of the substrate, and a buildup structure formed on the first surface of the substrate and having insulation layers and conductive layers. The buildup structure has an opening portion formed such that the light receiver of the imaging device is exposed from the opening portion of the buildup structure, and the insulation layers in the buildup structure include a first insulation layer formed on the first surface of the substrate.

27 Claims, 36 Drawing Sheets

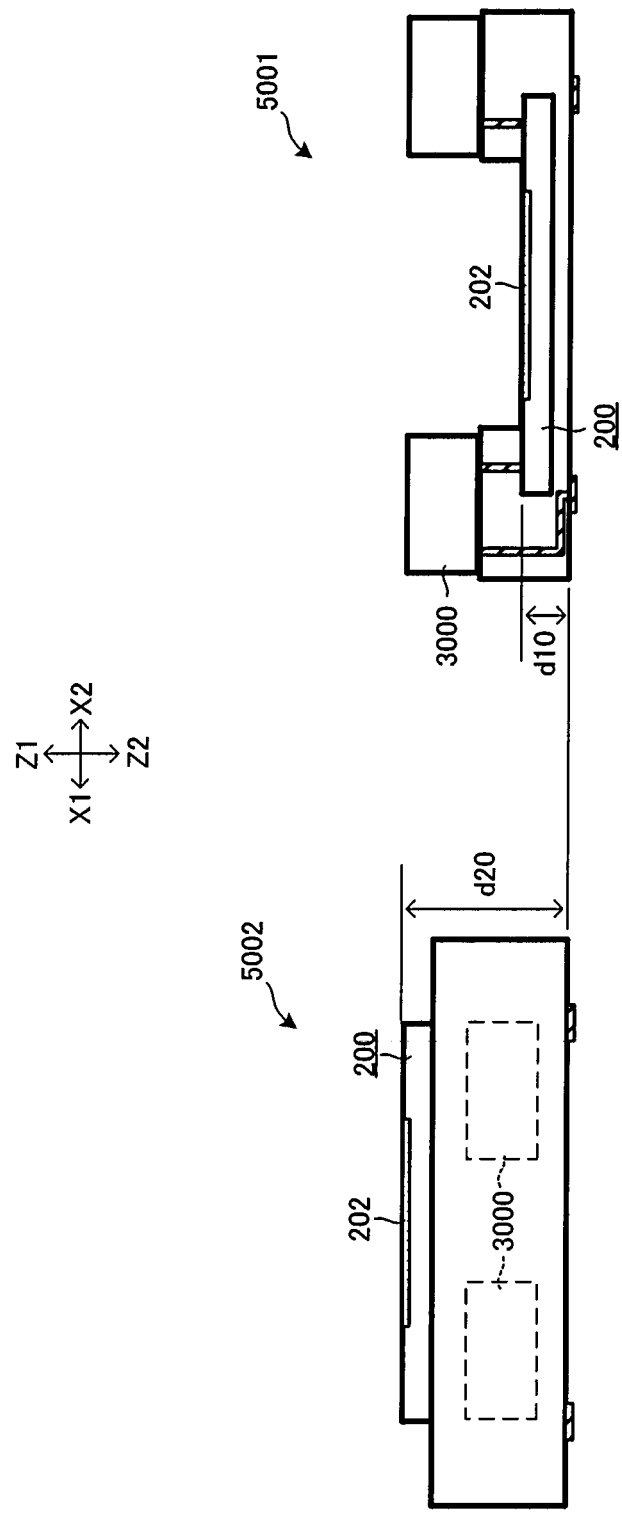

WIRING BOARD WITH BUILT-IN IMAGING DEVICE AND METHOD FOR MANUFACTURING SAME

CROSS-REFERENCE TO RELATED APPLICATIONS

The present application is based on and claims the benefits of priority to U.S. Application No. 61/447,195, filed Feb. 28, 2011, the entire contents of which are incorporated herein by reference.

BACKGROUND OF THE INVENTION

1. Field of the Invention

The present invention relates to a wiring board with a built-in imaging element and its manufacturing method.

2. Discussion of the Background

Japanese Laid-Open Patent Publication No. H11-191864 describes a lens block attached to one side of a substrate and an imaging element mounted on the other side of the substrate. Japanese Laid-Open Patent Publication No. 2007-60288 describes an imaging element and a lens block mounted on one side of a substrate. The contents of Japanese Laid-Open Patent Publication Nos. H11-191864 and 2007-60288 are incorporated herein by reference in their entirety in this application.

SUMMARY OF THE INVENTION

According to one aspect of the present invention, a wiring board with a built-in imaging element includes a substrate having an accommodation portion and a first surface and a second surface on the opposite side of the first surface, an imaging device having a light receiver and positioned in the accommodation portion of the substrate such that the light receiver faces the first surface of the substrate, and a buildup structure formed on the first surface of the substrate and having insulation layers and conductive layers. The buildup structure has an opening portion formed such that the light receiver of the imaging device is exposed from the opening portion of the buildup structure, and the insulation layers in the buildup structure include a first insulation layer formed on the first surface of the substrate.

According to another aspect of the present invention, a method for manufacturing a wiring board with a built-in imaging element includes forming an accommodation portion in a substrate, positioning an imaging device in the accommodation portion of the substrate, forming on the substrate a first insulation layer having a first opening portion such that a light receiver of the imaging device is exposed from the first opening portion, forming a first conductive layer on the first insulation layer, forming a second insulation layer on the first conductive layer and the first insulation layer, forming a second conductive layer on the second insulation layer, and forming a second opening portion in the second insulation layer such that the second opening portion is connected to the first opening portion and the light receiver of the imaging device is exposed through the first opening portion and the second opening portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4 is a view to compare dimensions (in particular, the height from the bottom surface to the light receiver) of the imaging device shown in FIG. 1 and of an imaging device relating to a comparative example;

DETAILED DESCRIPTION OF THE EMBODIMENTS

Figure 1:
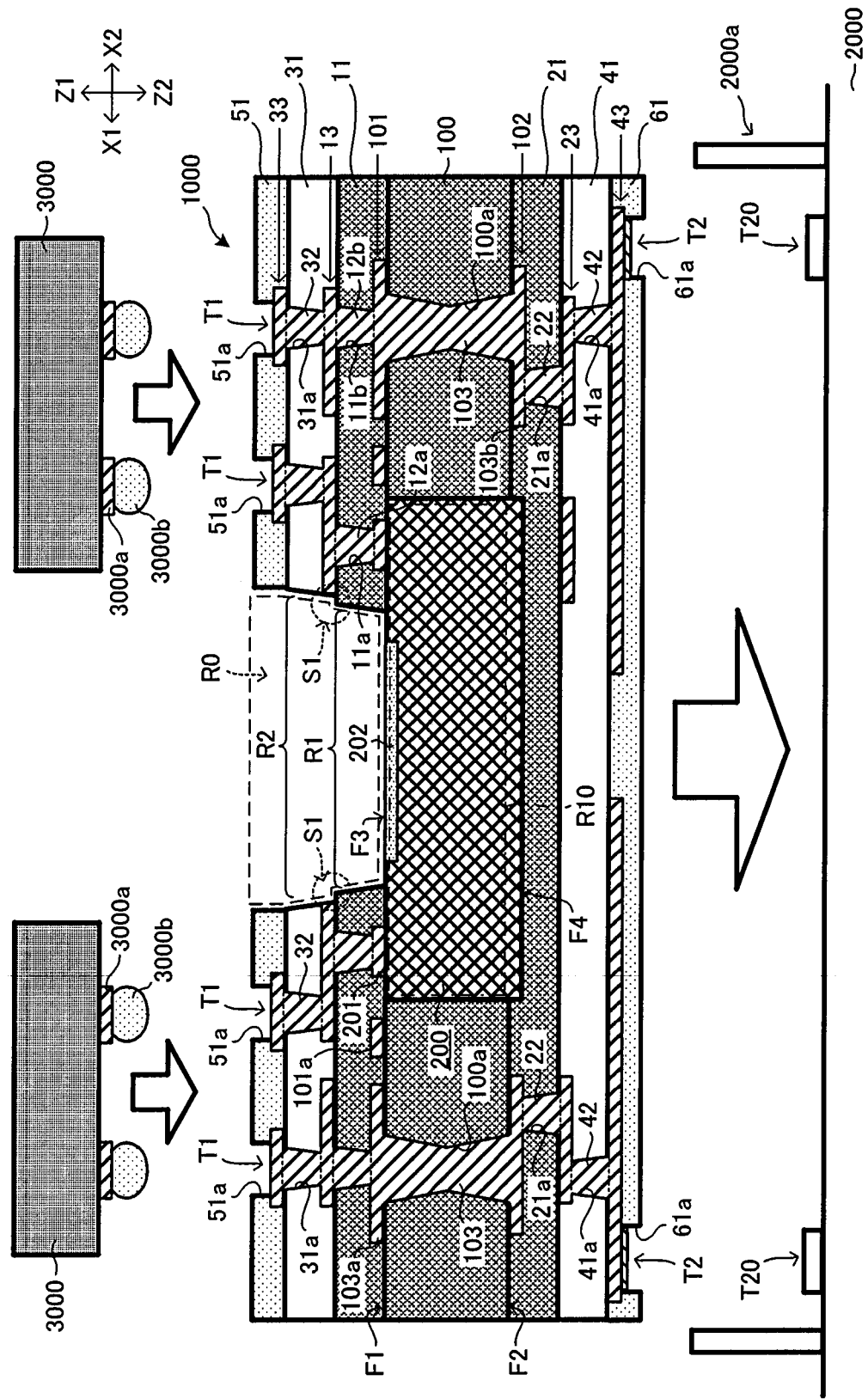
FIG. 1 is a cross-sectional view outlining a wiring board with a built-in imaging element according to a first embodiment of the present invention and an imaging device structured using the wiring board with a built-in imaging element.

The embodiments will now be described with reference to the accompanying drawings, wherein like reference numerals designate corresponding or identical elements throughout the various drawings.

In the drawings, arrows (Z1, Z2) each indicate a lamination direction corresponding to a direction along a normal line (or a thickness direction of a wiring board) to main surfaces (upper and lower surfaces) of each layer. On the other hand, arrows (X1, X2) and (Y1, Y2) each indicate a direction perpendicular to a lamination direction (direction parallel to the main surfaces of each layer). The main surfaces of each layer are on the X-Y plane. Also, side surfaces of each layer are on the X-Z plane or the Y-Z plane.

Two main surfaces facing opposite directions of a normal line are referred to as a first surface (the Z1-side surface) and a second surface (the Z2-side surface). Namely, a main surface opposite the first surface is the second surface, and a main surface opposite the second surface is the first surface. In lamination directions, the side closer to the core is referred to as a lower layer (or inner-layer side), and the side farther from the core is referred to as an upper layer (or outer-layer side). In addition, on the X-Y plane, the side farther from an imaging element is referred to as outside, and the side closer to the imaging element as inside.

A conductive layer may include wiring that forms a conductive circuit (including ground), a pad, a land or the like, or may include a plain pattern that does not form a conductive circuit.

Opening portions include a notch, a slit or the like other than a hole or a groove. A hole is not limited to being a penetrating hole, but may also be a non-penetrating hole. A hole may be a via hole, through hole or the like, and the conductor formed in a via hole is referred to as a via conductor, and the conductor formed in a through hole is referred to as a through-hole conductor.

An imaging element being positioned in an opening portion includes cases where the entire imaging element is completely accommodated in the opening portion, as well as cases where only part of the imaging element is positioned in the opening portion.

Plating includes dry plating such as PVD (physical vapor deposition) and CVD (chemical vapor deposition) along with wet plating such as electrolytic plating.

"Width" of a hole or a column (protruding portion) means a diameter if it is a circle and $2\sqrt{(\text{cross section}/\pi)}$ if it is other than a circle, unless otherwise indicated. When dimensions (such as width) of different shapes are compared, after the most appropriate values are compared among the values at a corresponding position of each shape, average values, maximum values and the like, while functions and effects obtained by such dimensions are considered, it is preferred to determine whether such values are the same or not. However, that is not the only option if values to be compared are described clearly.

First Embodiment

Wiring board 1000 of the present embodiment is a wiring board with a built-in imaging element. As shown in FIG. 1, wiring board 1000 has substrate 100 (core substrate), imaging element 200, insulation layers (11, 21, 31, 41) (interlayer insulation layers), conductive layers (101, 102, 13, 23, 33, 43), via conductors (12a, 12b, 22, 32, 42) and solder resists (51, 61).

Wiring board 1000 is a buildup multilayer printed wiring board, and substrate 100 becomes the core substrate of wiring board 1000. Hereinafter, of the upper and lower surfaces (two main surfaces) of substrate 100, the surface on which insulation layer 11 (first insulation layer) is formed is referred to as first surface (F1) and the surface opposite first surface (F1) is referred to as second surface (F2). Two insulation layers (11, 31) and two conductive layers (13, 33) are alternately laminated on the first-surface (F1) side of substrate 100, and two insulation layers (21, 41) and two conductive layers (23, 43) are alternately laminated on the second-surface (F2) side of substrate 100. Via conductors (12a, 12b) are formed in insulation layer 11, and via conductors (22, 32, 42) are formed respectively in insulation layers (21, 31, 41). Via conductors (12a, 12b, 22, 32, 42) electrically connect their respective upper and lower conductive layers through an interlayer insulation layer. In addition, through-hole conductor 103 is formed in substrate 100, and conductive layers (101, 102) on both surfaces of substrate 100 are electrically connected to each other via through-hole conductor 103. Via conductors (12b, 32) and through-hole conductor 103 are each a filled conductor, and they are stacked in a direction Z. Wiring board 1000 of the present embodiment is a rigid wiring board. However, wiring board 1000 may also be a flexible wiring board.

Opening portion (R10) in a rectangular sheet shape, for example, is formed in substrate 100. Opening portion (R10) is a hole that penetrates through substrate 100. Imaging element 200 is a sensor chip having an outline (such as a rectangular sheet) corresponding to the shape of opening portion (R10), for example. The thickness of imaging element 200 substantially corresponds to the depth of opening portion (R10) (a hole). Also, the thickness of substrate 100 including conductive layers (101, 102) on both surfaces substantially corresponds to the thickness of imaging element 200 including electrode 201. Imaging element 200 is positioned on a side of substrate 100 (either direction X or direction Y) by being placed in opening portion (R10). In the present embodiment, substantially the entire imaging element 200 is completely accommodated in opening portion (R10). However, the present embodiment is not limited to such, and only part of imaging element 200 may be positioned in opening portion (R10). Also, in the present embodiment, imaging element 200 is fitted in opening portion (R10) so that imaging element 200 is fixed to substrate 100. However, the present embodiment is not limited to such, and imaging element 200 and substrate 100 may be connected using an adhesive agent. In addition, resin that has flowed from insulation layers (11, 21) may be filled in the space between imaging element 200 and substrate 100.

Imaging element 200 is a chip of a CCD (charge coupled device) image sensor, for example. However, the type of imaging element 200 is not limited specifically to the above. For example, it may be a chip of a CMOS (complementary metal oxide semiconductor) image sensor. Imaging element 200 has electrode 201 and light receiver 202. Hereinafter, of the upper and lower surfaces (two main surfaces) of imaging element 200, the surface on which insulation layer 11 (first insulation layer) is formed is referred to as first surface (F3)

and the surface opposite first surface (F3) is referred to as second surface (F4). Light receiver 202 is formed on first surface (F3) of imaging element 200.

In the present embodiment, first surface (F3) corresponds to the sensor surface, and second surface (F4) corresponds to the chip bottom. The shape of the main surfaces of imaging element 200 and the shape of light receiver 202 are both substantially rectangular. However, the shapes and the like of imaging element 200 and its light receiver 202 are not limited specifically to the above.

Conductive layer 33 (second conductive layer) is the outermost layer of one side (Z1 side) of wiring board 1000, and conductive layer 43 is the outermost layer of the other side (Z2 side) of wiring board 1000. Solder resists (51, 61) are formed respectively on conductive layers (33, 43). However, since solder resists (51, 61) have opening portions (51a, 61a) respectively, solder resists (51, 61) are not formed on conductive layers (33, 43) in opening portions (51a, 61a).

A predetermined portion of conductive layer 33 (a portion corresponding to opening portion 51a) is exposed without being covered by solder resist 51 and becomes external connection terminal (T1) (pad) for mounting an electronic component. Electrode (3000a) of electronic component 3000 is electrically connected to external connection terminal (T1) (pad) of wiring board 1000 via solder (3000b) (solder bump), for example. Namely, electronic component 3000 (soldering, for example) is mounted on wiring board 1000 through external connection terminal (T1). As described, in the present embodiment, a predetermined portion of outermost conductive layer 33 (second conductive layer) works as external connection terminal (T1) for mounting an electronic component.

In addition, external connection terminal (T2) for connection with another wiring board is formed in the outermost layer (conductive layer 43) opposite external connection terminal (T1). More specifically, a predetermined portion of conductive layer 43 (portion corresponding to opening portion 61a) is exposed without being covered by solder resist 61 and becomes external connection terminal (T2) (pad) for connection with anther wiring board.

External connection terminal (T2) (pad) of wiring board 1000 is connected to, for example, pad (T20) of socket (2000a) in motherboard 2000. In doing so, wiring board 1000 and motherboard 2000 are electrically connected. Namely, wiring board 1000 is mounted on another wiring board such as motherboard 2000 through external connection terminal (T2). In the present embodiment, conductive layers (23, 43) on the second-surface (F2) side of substrate 100 have conductive patterns that fan out. As described, wiring board 1000 of the present embodiment has external connection terminal (T2) for connection with another wiring board on the outermost layer opposite external connection terminal (T1).

When motherboard 2000 is a circuit board for a cell phone, by arranging a lens block in light receiver 202 of imaging element 200, for example, wiring board 1000 is formed as a camera module of a cell phone.

Substrate 100 is made of resin, for example. In particular, substrate 100 is made by, for example, impregnating glass cloth as core material with epoxy resin (hereinafter referred to as glass epoxy). In the present embodiment, substrate 100 is made of resin containing core material. Core material is a material having a smaller thermal expansion coefficient than a main material (epoxy resin in the present embodiment). Basically, the shape, thickness, material and the like of insulation layers are determined freely. For example, instead of epoxy resin, the following may also be used: polyester resin, bismaleimide triazine resin (BT resin), imide resin (polyim-ide), phenol resin, allyl polyphenylene ether resin (A-PPE resin) or the like. In addition, as the core material, for example, glass fabric (such as glass cloth or glass non-woven fabric), aramid fabric (such as aramid non-woven fabric), or inorganic material such as silica filler is preferred.

Conductive layer 101 is formed on first surface (F1) of substrate 100, and conductive layer 102 is formed on second surface (F2) of substrate 100. Through hole (100a) is formed in substrate 100. Then, by filling conductor (such as copper plating) in through hole (100a), through-hole conductor 103 is formed. The shape of through-hole conductor 103 is like that of an hourglass, for example. However, through-hole conductor 103 is not limited to such a shape and may be any other shape; for example, it may be substantially columnar. Through-hole conductor 103 connects conductive layer 101 and conductive layer 102 to each other, for example. Conductive layer 101 includes land (103a) of through-hole conductor 103 and other wiring (101a), and conductive layer 102 includes land (103b) of through-hole conductor 103.

In the present embodiment, insulation layers (11, 21) are each made of resin containing core material, and insulation layers (31, 41) are each made of resin without core material. Specifically, for example, insulation layers (11, 21) are each made of glass epoxy, and insulation layers (31, 41) are each made of epoxy resin, for example. However, the shape, thickness, material and the like of insulation layers (11, 21, 31, 41) are not limited to the above, and basically, they are determined freely. For example, instead of epoxy resin, the following may also be used: polyester resin, bismaleimide triazine resin (BT resin), imide resin (polyimide), phenol resin, allyl polyphenylene ether resin (A-PPE resin) or the like. Each insulation layer may be formed with multiple layers of different materials.

Conductive layers (101, 102, 13, 23, 33, 43) and via conductors (12a, 12b, 22, 32, 42) are each made of copper, for example (in particular, any one of copper foil, electroless copper plating, electrolytic copper plating, a combination of those, or the like). However, the material of conductive layers and via conductors is not limited to the above and may be selected freely. Each conductive layer and each via conductor may be formed with multiple layers of different materials.

Solder resists (51, 61) are made of, for example, resins such as photosensitive resin using an acrylic-epoxy type resin, thermosetting resin mainly containing epoxy resin, ultraviolet setting resin, or the like. However, the material of solder resists (51, 61) is not limited specifically to the above.

Insulation layer 11 (first insulation layer) is formed on first surface (F1) of substrate 100. Conductive layer 13 (first conductive layer) is formed on insulation layer 11. Insulation layer 31 (second insulation layer) is formed on conductive layer 13. Conductive layer 33 (second conductive layer) is formed on insulation layer 31. Then, conductive layer 33 becomes an outermost layer.

Insulation layer 11 is formed not only on first surface (F1) of substrate 100 but also on imaging element 200 in such a way to expose light receiver 202 of imaging element 200. Specifically, opening portion (R1) (first opening portion) is formed in insulation layer 11 to expose light receiver 202 of imaging element 200. Opening portion (R1) is formed as a penetrating hole (first penetrating hole) that penetrates through insulation layer 11. Also, in insulation layer 31, opening portion (R2) (second opening portion) having a greater width than opening portion (R1) (first penetrating hole) is formed so as to be connected to opening portion (R1). Opening portion (R2) is formed as a penetrating hole (second penetrating hole) that penetrates through insulation layer 31. Opening portion (R1) and opening portion (R2) are connected, and a hole is further formed to penetrate through solder resist 51. Accordingly, opening portion (RO) is a hole that penetrates through insulation layers (11, 31) and solder resist 51. Namely, in insulation layers (11, 31) and solder resist 51, opening portion (R0) is formed to penetrate through them and reach light receiver 202 of imaging element 200, and light receiver 202 is exposed through opening portion (R0).

Figure 2:
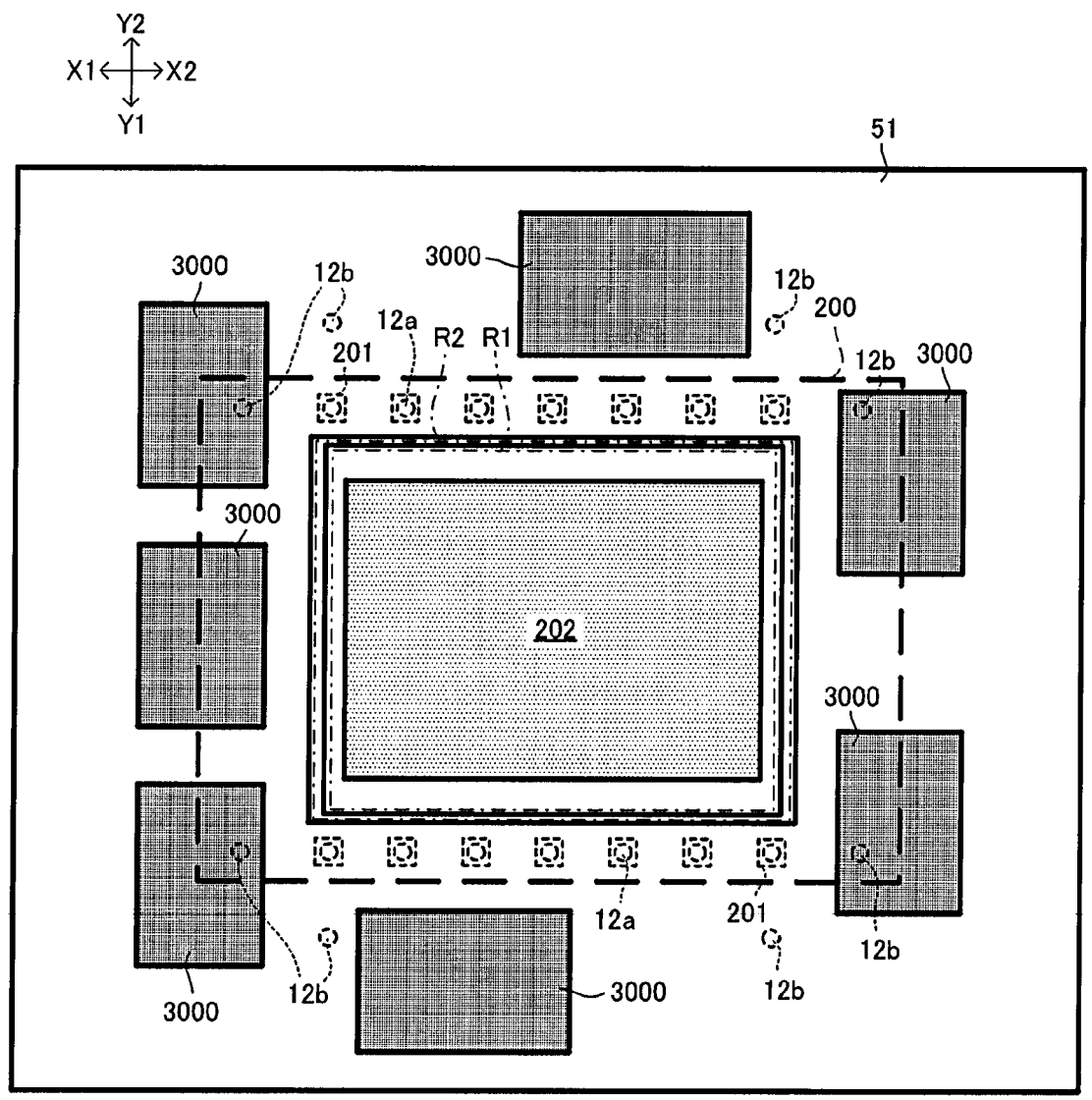
FIG. 2 is a plan view showing positions of an imaging element and the like that form a wiring board with a built-in imaging element according to the first embodiment of the present invention.
Figure 3A:
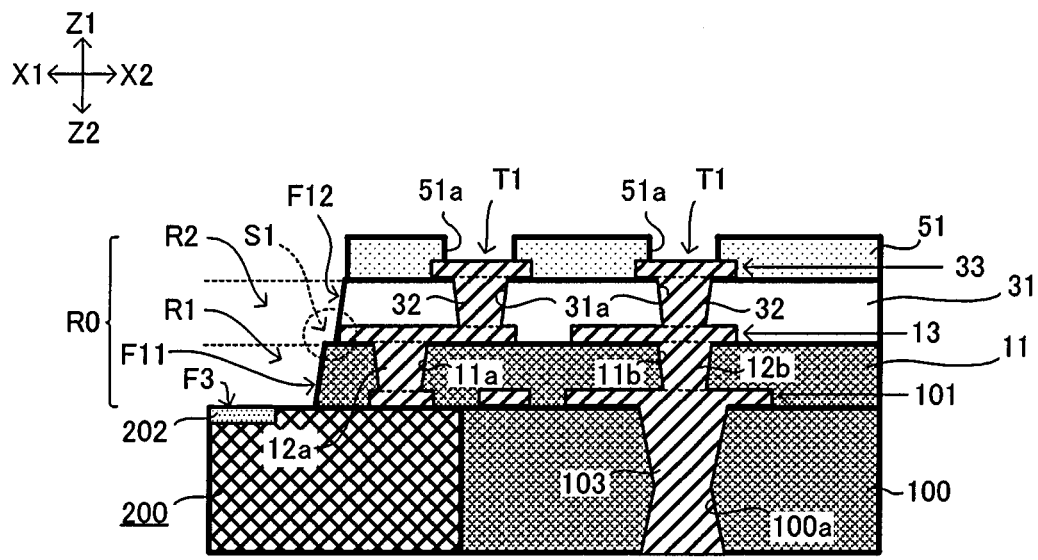
FIG. 3A is a magnified view showing the vicinity of an opening portion in the substrate that forms the wiring board with a built-in imaging element shown in FIG. 1.

In the present embodiment, light receiver 202 is positioned in the central portion of imaging element 200 and electrodes 201 are positioned in the peripheral portions (two facing sides, for example) of imaging element 200 as shown in FIGS. 1 and 2. Insulation layer 11 formed on imaging element 200 covers the entire peripheral portion (four sides) of imaging element 200 including electrodes 201. Then, an edge of insulation layer 11 (a peripheral portion of opening portion R1) is positioned on a peripheral portion of imaging element 200, and an edge of insulation layer 31 (a peripheral portion of opening portion R2) is positioned on the edge of insulation layer 11 (the peripheral portion of opening portion R1) as shown in FIG. 3A. The edge of insulation layer 11 and the edge of insulation layer 31 are formed to be a step. Here, side surface (F11) of insulation layer 11 positioned on imaging element 200 is positioned closer to light receiver 202 than is side surface (F12) of insulation layer 31 positioned on insulation layer 11. Namely, side surface (F11) of insulation layer 11 protrudes toward light receiver 202 from side surface (F12) of insulation layer 31. In doing so, since the position of side surface (F11) is shifted from the position of side surface (F12), step portion (S1) is formed between insulation layer 11 and insulation layer 31. In the present embodiment, since insulation layer 31 is made of resin that does not contain core material, an opening with a required size is easier to form, and above step portion (S1) is formed easily.

In the present embodiment, conductive layer 13 extends to side surface (F12), and an edge of conductive layer 13 is positioned at step portion (S1). Specifically, conductive layer 13 includes a conductive pattern that extends to the vicinity of side surface (F12) of insulation layer 31. The position of a side surface of such a conductive pattern substantially corresponds to the position of side surface (F12) of insulation layer 31.

Figure 3B:
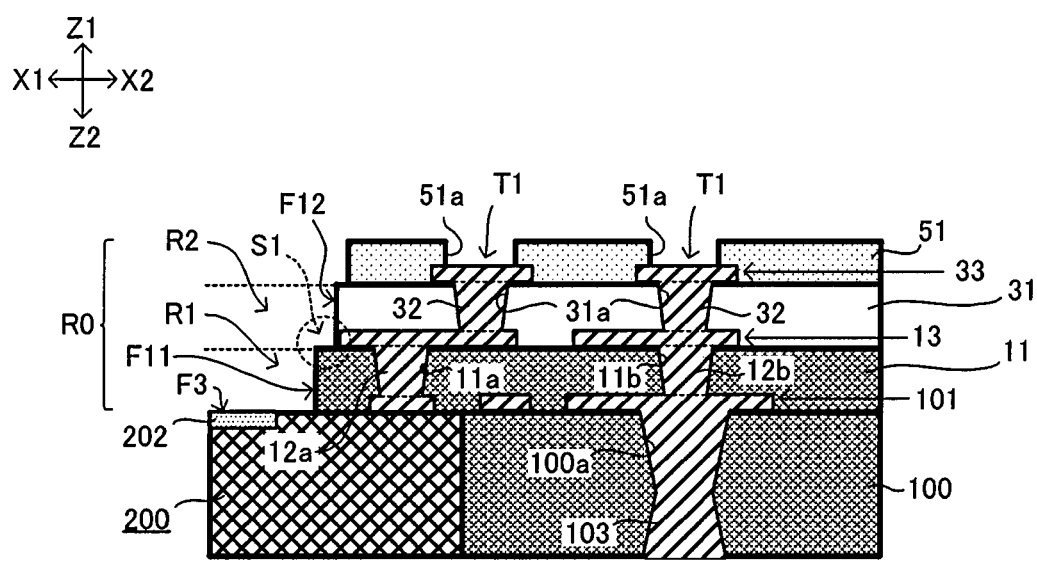
FIG. 3B is a view showing another example of the shape of an opening portion for exposing the light receiver of an imaging element.

In the present embodiment, side surfaces (F11, F12) facing opening portion (R0) form an inclined surface to first surface (F3) (sensor surface) of imaging element 200 as shown in FIG. 3A. Namely, the shape of opening portions (R1, R2) is a tapered rectangular column (truncated pyramid) that tapers with a diameter increasing from substrate 100 (core substrate) toward upper layers, for example. However, the shape of opening portions (R1, R2) is not limited to such, and it may be substantially rectangular as shown in FIG. 3B, and side surfaces (F11, F12) may be substantially perpendicular to first surface (F3) (sensor surface) of imaging element 200. The shape of horizontal cross sections (X-Y plane) of opening portions (R1, R2) is substantially rectangular, for example. The difference between the width of opening portion (R1) and the width of opening portion (R2) is preferred to be in such a range that a step (step portion S1) is secured while wiring regions are not sacrificed. Specifically, the range is preferred to be approximately 10 μm or greater and approximately 100 μm or less. Opening portions (R1, R2) are each shaped to correspond to the shape of light receiver 202 (similar shape with substantially the same size, for example), and mostly expose only light receiver 202.

Holes (11a, 11b) (via holes) are formed in insulation layer 11. By filling conductor (for example, copper plating) in holes (11a, 11b) respectively, the conductors in holes (11a, 11b) become via conductors (12a, 12b) respectively (filled conductors). Hole (11a) exposes electrode 201 of imaging element 200, and via conductor (12a) in hole (11a) is connected to electrode 201. Then, electrode 201 of imaging element 200 and conductive layer 13 on insulation layer 11 are electrically connected to each other through via conductor (12a). In addition, conductive layer 101 on substrate 100 (core substrate) and conductive layer 13 on insulation layer 11 are electrically connected to each other through via conductor (12b).

Hole (31a) (via hole) is formed in insulation layer 31. By filling conductor (for example, copper plating) in hole (31a), the conductor in hole (31a) becomes via conductor 32 (filled conductor). Hole (31a) exposes conductive layer 13, and via conductor 32 in hole (31a) is connected to conductive layer 13. Then, conductive layer 13 on insulation layer 11 and conductive layer 33 on insulation layer 31 are electrically connected to each other through via conductor 32.

As described above, hole (11a) (first via hole) reaching electrode 201 of imaging element 200 is formed in insulation layer 11 (first insulation layer), and hole (31a) (second via hole) reaching conductive layer 13 (first conductive layer) is formed in insulation layer 31 (second insulation layer) in the present embodiment. Then, electrode 201 of imaging element 200 and external connection terminal (T1) are electrically connected to each other through the conductor in hole (11a) (via conductor 12a), conductive layer 13 and the conductor in hole (31a) (via conductor 32).

Meanwhile, insulation layer 21 is formed on second surface (F2) of substrate 100. Conductive layer 23 is formed on insulation layer 21. Insulation layer 41 is formed on conductive layer 23. Conductive layer 43 is formed on insulation layer 41. Then, conductive layer 43 becomes the outermost layer.

Wiring board 1000 has insulation layer 21 (third insulation layer) on second surface (F2) of substrate 100. Insulation layer 21 blocks the opening on one side (opening on the Z2 side) of opening portion (R10) (hole). Accordingly, opening portion (R10) is formed as a hole with a bottom (recessed portion). Insulation layer 21 covers second surface (F4) of imaging element 200.

Via conductors (12a, 12b, 22, 32, 42) are each made of copper plating, for example. The shape of via conductors (12a, 12b, 22, 32, 42) is, for example, a tapered column (truncated cone) that tapers with a diameter increasing from the side of substrate 100 (core substrate) toward a further upper layer. The shape of horizontal cross sections of via conductors (X-Y plane) is substantially a complete circle, for example. However, the shape of via conductors is not limited to such, and may be any other shape.

Via conductors (12a, 12b, 22, 32, 42) and through-hole conductor 103 positioned near imaging element 200 are each preferred to be a filled conductor. In doing so, strength near imaging element 200 is enhanced. Especially, since via conductors (12b, 32) and through-hole conductor 103 are stacked in the present embodiment, even greater strength is obtained. In addition, by stacking those filled conductors, it is easy to secure wiring space, making it easier to form high-density wiring. Those filled conductors are preferred to be positioned in such a manner that would mitigate stress exerted on imaging element 200. Specifically, as shown in FIG. 2, for example, it is preferred that via conductor (12a) be positioned around light receiver 202 and the stack structure (via conductors (12b) and the like) be positioned on the outer side of via conductor (12b) (four corners of imaging element 200, for example).

In wiring board 1000 (wiring board with a built-in imaging element) of the present embodiment, it is easier to lower the sensor surface because of the above structure. In the following, the reasons are described by referring to FIG. 4. FIG. 4 is a view to compare the dimensions (in particular the height from the bottom surface to light receiver 202) in imaging device 5001 formed using wiring board 1000 of the present embodiment and imaging device 5002 relating to a comparative example. In FIG. 4, for the ease of description, the same numerical reference is applied to the elements corresponding to each other in imaging device 5001 and imaging device 5002.

Imaging element 200 is mounted on a surface of imaging device 5002. Height (d20) from the bottom surface to light receiver 202 in imaging device 5002 is approximately 0.6~approximately 0.8 mm, for example. By contrast, since imaging element 200 is built into imaging device 5001, it is easier to reduce height (d10) from the bottom surface to light receiver 202 in imaging device 5001. Specifically, height (d10) is reduced to approximately 0.3 mm. As described, wiring board 1000 of the present embodiment has a structure where the sensor surface is easily set lower.

In wiring board 1000 of the present embodiment, since first surface (F3) (sensor surface) of imaging element 200 is set at a lower position, the height of the entire module is reduced. As a result, it is easier to respond to a larger lens block and a higher number of pixels in imaging element 200 (image sensor). In addition, effects are expected such as light receiver 202 of imaging element 200 becoming resistant to damage.

Since insulation layer 11 is formed not only on substrate 100 but also on imaging element 200 (a portion where no light receiver is formed), it is easier to secure a region for mounting electronic component 3000 on the surface. Furthermore, since opening portion (R0) mostly exposes only light receiver 202, a larger region is secured on the surface.

In wiring board 1000 of the present embodiment, hole (11a) (first via hole) reaching electrode 201 of imaging element 200 is formed in insulation layer 11 (a portion where no opening is formed), and electrode 201 of imaging element 200 and conductive layer 13 on insulation layer 11 are electrically connected through via conductor (12a) in hole (11a). Moreover, wiring board 1000 of the present embodiment has two buildup layers (insulation layer 11 and conductive layer 13, insulation layer 31 and conductive layer 33). Accordingly, it is easier to respectively secure a wiring region for imaging element 200 in the inner layer (conductive layer 13) of wiring board 1000, and a mounting region for electronic component 3000 in the outer layer (conductive layer 33) of wiring board 1000.

In the present embodiment, insulation layer 11 is made of resin containing core material, and insulation layer 31 is made of resin without core material. Accordingly, damage to imaging element 200 that would be generated from external force exerted on substrate 100 tends to be mitigated. In addition, since insulation layer 31 does not contain core material, it is easier to form an opening with a required size in insulation layer 31 by cutting, and scraping core material seldom occurs during cutting.

Figure 5:
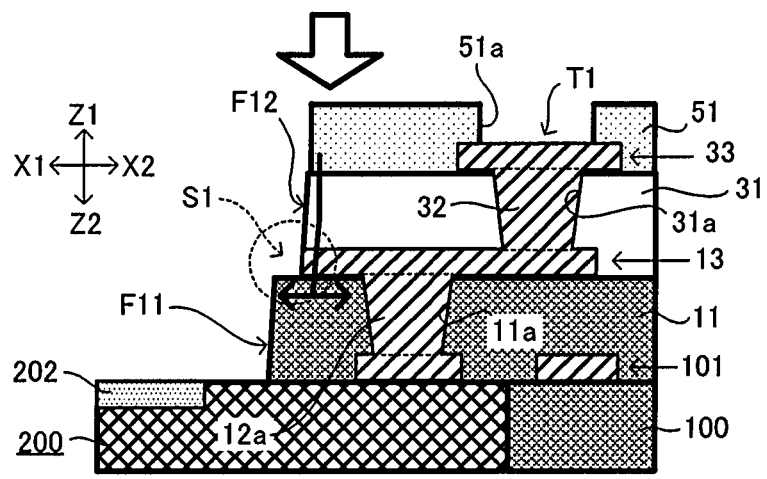
FIG. 5 is a view showing the directions in which force travels when external force is exerted in a direction Z on a wiring board with a built-in imaging element according to the first embodiment of the present invention.

In the present embodiment, step portion (S1) is formed between insulation layer 11 and insulation layer 31. Accordingly, as shown in FIG. 5, for example, when external force in a direction Z is exerted on wiring board 1000 of the present embodiment, such force tends to be dispersed at step portion (S1) in a direction X or a direction Y. As a result, damage to imaging element 200 tends to be mitigated. Also, in the present embodiment, conductive layer 13 includes a conductive pattern which extends to the vicinity of side surface (F12) of insulation layer 31. Accordingly, an edge of conductive layer 31 is positioned at step portion (S1). Since conductive layer 13 made of copper (metal) is harder than insulation layer 31 made of resin, when an edge of conductive layer 13 is positioned at step portion (S1), it is thought that force tends to be dispersed.

Figure 6:
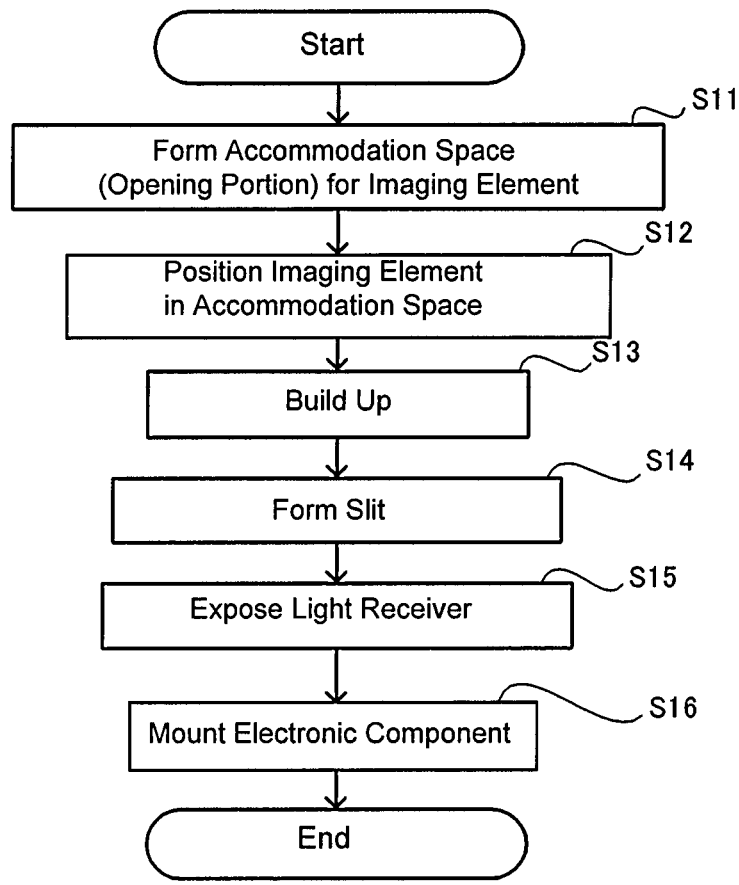
FIG. 6 is a flowchart showing a method for manufacturing a wiring board with a built-in imaging element according to the first embodiment of the present invention.

In the following, a method for manufacturing wiring board 1000 is described by referring to FIG. 6 and the like. FIG. 6 is a flowchart outlining the contents and the order of the method for manufacturing wiring board 1000 according to the present embodiment.

Figure 7A:
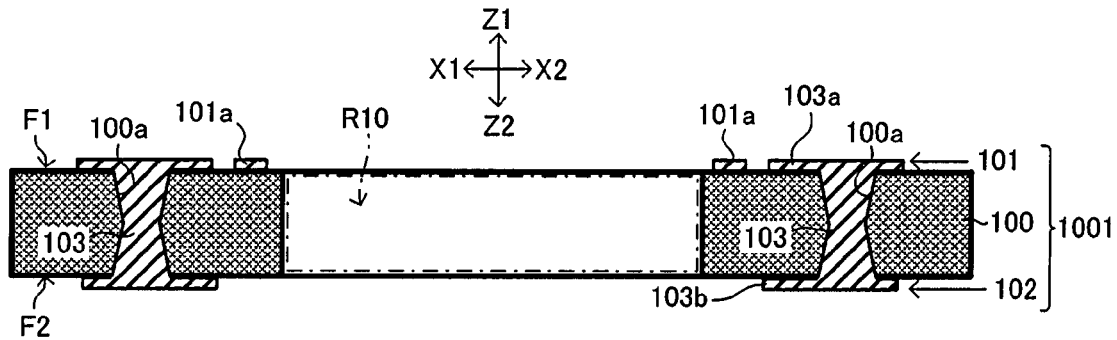
FIG. 7A is a view to illustrate a step for forming an accommodation space (opening portion) for an imaging element in a starting substrate in the manufacturing method shown in FIG. 6.

In step (S11), as shown in FIG. 7A, wiring board 1001 (starting material) is prepared, and using a laser or a drill, for example, opening portion (R10) (accommodation space for imaging element 200) is formed in wiring board 1000 (in particular, substrate 100). Opening portion (R10) is a hole that penetrates through substrate 100.

Wiring board 1001 is a double-sided copper-clad laminate, for example. In the present embodiment, wiring board 1001 is formed with substrate 100, conductive layer 101 formed on first surface (F1) of substrate 100, conductive layer 102 formed on second surface (F2) of substrate 100, and through-hole conductor 103. Conductive layers (101, 102) have a triple-layer structure of copper foil (lower layer), electroless copper plating (middle layer) and electrolytic copper plating (upper layer), for example. Hourglass-shaped through hole (100a) is formed by irradiating a laser from both sides of substrate 100, for example. Then, by performing electroless and electrolytic copper plating, for example, where copper foil is formed on substrate 100 and through hole (100a) is formed in substrate 100, conductive layers (101, 102) and through-hole conductor 103 are formed.

Figure 7B:
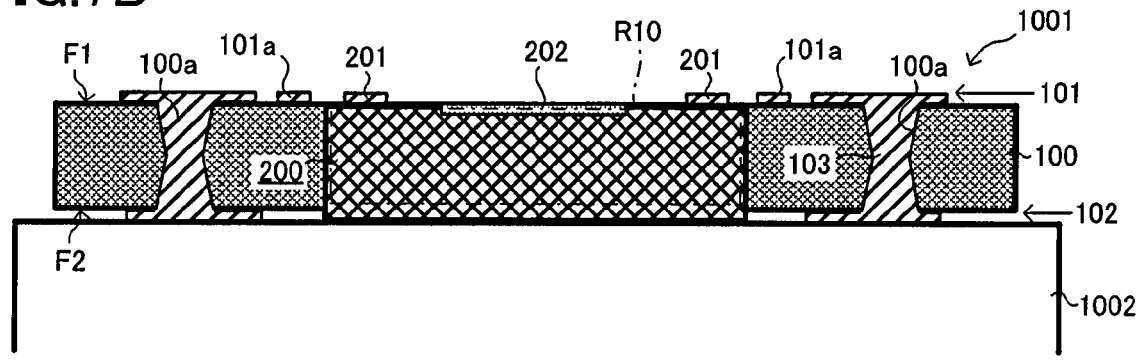
FIG. 7B is a view to illustrate a step for placing a wiring board on a carrier and a step for positioning an imaging element in the opening portion of the wiring board in the manufacturing method shown in FIG. 6.

As shown in FIG. 7B, wiring board 1001 having opening portion (R10) is placed on carrier 1002 (base stand). Carrier 1002 is attached to the second-surface (F2) side of substrate 100.

In step (S12) in FIG. 6, imaging element 200 is positioned in opening portion (R10) of wiring board 1001 as shown in FIG. 7B.

Figure 8:
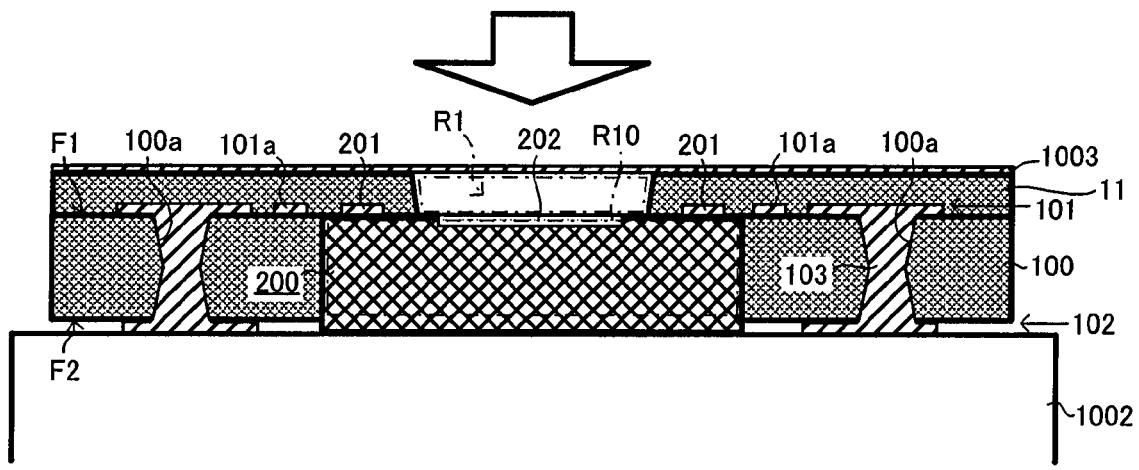
FIG. 8 is a view to illustrate a step for preliminarily adhering the imaging element in the manufacturing method shown in FIG. 6.

As shown in FIG. 8, semicured insulation layer 11 having opening portion (R1) (first opening portion) is formed on first surface (F1) of substrate 100. Accordingly, conductive layer 101 and electrode 201 are covered with insulation layer 11. Moreover, copper foil 1003 is formed on insulation layer 11. Insulation layer 11 is, for example, prepreg of thermosetting glass epoxy. Then, by pressing insulation layer 11 while it is semicured (prepreg), resin is flowed from insulation layer 11. Accordingly, insulative body (resin that forms insulation layer 11) is filled between substrate 100 and imaging element 200. After that, the insulative body (hereinafter referred to as filler resin) and imaging element 200 are preliminarily adhered. Specifically, support capability is generated in filler resin through heating to a degree sufficient to support imaging element 200. Accordingly, imaging element 200 which was supported by carrier 1002 is supported by substrate 100. Then, carrier 1002 is removed from the wiring board. In addition, the wiring board is cleansed if necessary.

At this stage, filler resin and insulation layer 11 are only semicured, and not completely cured. However, they are not limited to such, and may be completely cured at this stage.

In step (S13) in FIG. 6, building up is performed on each main surface of the wiring board.

Figure 9:
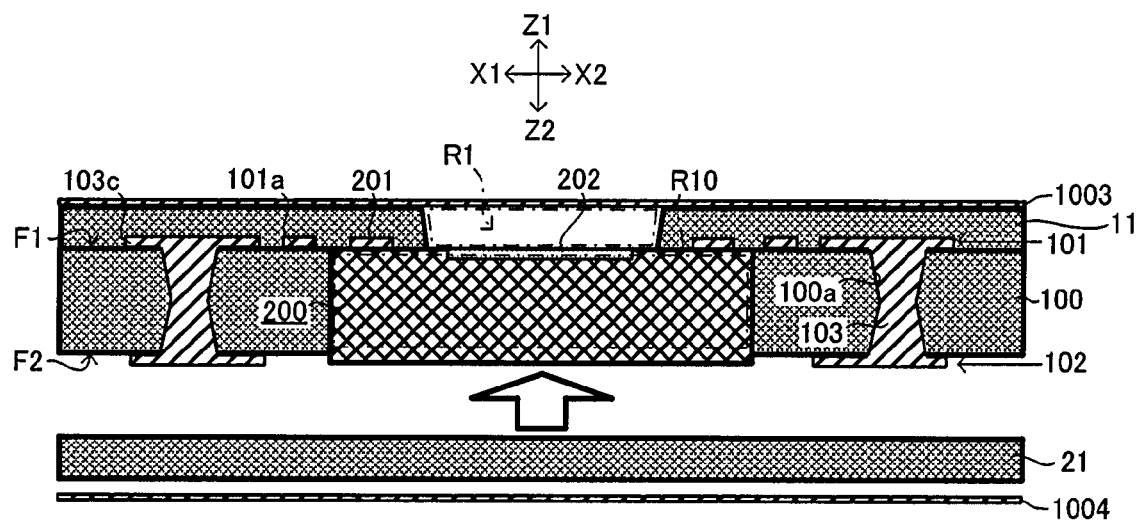
FIG. 9 is a view to illustrate a first step for building up a first layer in the manufacturing method shown in FIG. 6.

Specifically, insulation layer 21 is formed on second surface (F2) of substrate 100 as shown in FIG. 9. In doing so, conductive layer 102 is covered with insulation layer 21. Also, copper foil 1004 is formed on insulation layer 21. Insulation layer 21 is made of prepreg of thermosetting glass epoxy, for example. Insulation layer 21 is adhered to substrate 100 by pressing, for example, while it is prepreg. Then, insulation layers (11, 21) are each cured by heating. In the present embodiment, insulation layers (11, 21) are simultaneously cured, but the present embodiment is not limited to such, and curing insulation layers (11, 21) may be conducted separately.

Figure 10:
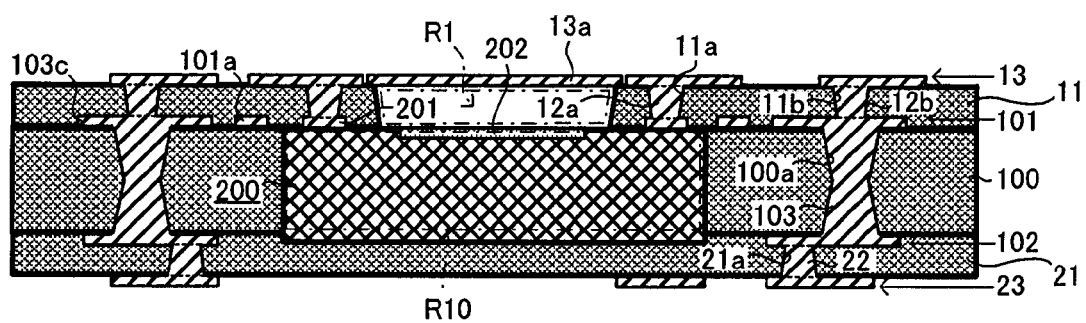
FIG. 10 is a view to illustrate a second step subsequent to the step in FIG. 9.

As shown in FIG. 10, holes (11a, 11b) (via holes) are formed in insulation layer 11 using a laser, for example, and hole (21a) (via hole) is formed in insulation layer 21 using a laser, for example. Then, desmearing is conducted if required.

Figure 11:
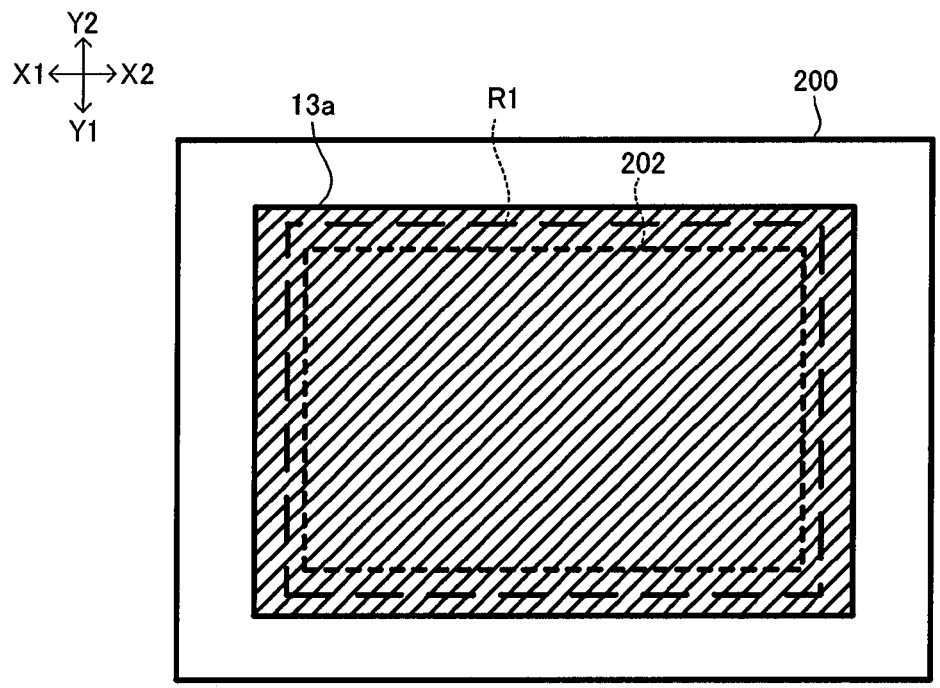
FIG. 11 is a view showing the shape or the like of a plain conductive pattern positioned in the step shown in FIG. 10.

As shown in FIG. 10, electroless copper-plated film is formed by a chemical plating method, for example, and electrolytic copper-plated film is further formed on its top by a pattern plating method, for example. Specifically, after electroless plated film is formed by immersing the wiring board having via holes in a plating solution, electrolytic plated film is formed by using plating resist having opening portions corresponding to conductive layer 13 and conductive pattern (13a) or to the conductive pattern of conductive layer 23. Then, by removing unnecessary electroless plating, conductive layer 13 and conductive pattern (13a) are formed on insulation layer 11, and conductive layer 23 is formed on insulation layer 21, while via conductors (12a, 12b, 22) are formed respectively in holes (11a, 11b, 21a). The shape of conductive pattern (13a) is substantially a plain sheet, for example. As shown in FIG. 11, conductive pattern (13a) has a size a little larger than light receiver 202 of imaging element 200, and is positioned directly on the entire light receiver 202 (in a direction Z) in the present embodiment. Here, prior to electroless plating, surfaces of insulation layers (11, 21) may be roughened, a catalyst may be adsorbed, or the like.

Buildup is Further Continued.

Specifically, insulation layer 31 and copper foil (copper foil with resin, for example) are formed on insulation layer 11, and insulation layer 41 and copper foil (copper foil with resin, for example) are formed on insulation layer 21 (see FIG. 1). Insulation layers (31, 41) are each made of epoxy resin, for example.

By a method the same as the above method for forming lower layers, for example, holes (31a, 41a), via conductors (32, 42) and conductive layers (33, 43) are formed (see FIG. 1). Here, conductive layer 33 may include a plain conductive pattern to be positioned directly on entire light receiver 202 (in a direction Z). Since conductive layers (33, 43) become outermost layers and predetermined portions of conductive layers (33, 43) become pads that are not covered with solder resists (51, 61), Ni/Au film (corrosion resistant metal film) may be formed on conductive layers (33, 43) (pads) by electrolytic Ni plating, sputtering or the like, for example, or an OSP treatment may be conducted.

Solder resist 51 having opening portion (51a) and solder resist 61 having opening portion (61a) are formed respectively on insulation layers (31, 41) (see FIG. 1). Conductive layers (33, 43) are covered with solder resists (51, 61) respectively except for predetermined portions corresponding to opening portions (51a, 61a). A predetermined portion of conductive layer 33 (a portion corresponding to opening portion (51a)) becomes external connection terminal (T1) (pad) for mounting an electronic component. Also, a predetermined portion of conductive layer 43 (a portion corresponding to opening portion (61a)) becomes external connection terminal (T2) (pad) for connection with another wiring board. Solder resists (51, 61) are formed, for example, by screen printing, spray coating, roll coating, lamination or the like.

Figure 12:
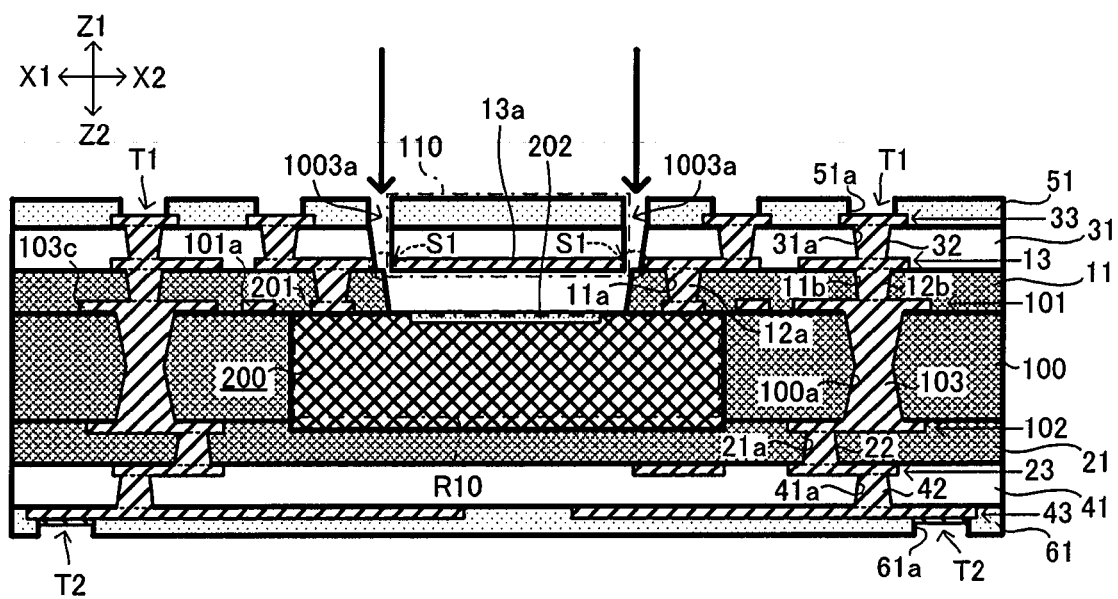
FIG. 12 is a view to illustrate a step for forming a recessed portion around the opening portion in the manufacturing method shown in FIG. 6.

In step (S14) in FIG. 6, recessed portion (1003a) (slit) penetrating insulation layer 31 and reaching insulation layer 11 is formed as shown in FIG. 12, for example. Recessed portion (1003a) is a groove continuously formed in the entire circumference of opening portion (R1), for example. However, the manner to form recessed portion (1003a) (shape, dimensions or the like) is not limited specifically as long as opening portion (R0) is formed (FIG. 13A).

When recessed portion (1003a) is formed, insulation layer 11, conductive pattern (13a), insulation layer 31 and solder resist 51 which are positioned on opening portion (R1) are separated from the surrounding portions. In the following, the separated portion is referred to as cover portion 110.

Recessed portion (1003a) is formed by a laser, for example. By irradiating a laser at a surface of a wiring board (the main surface on the Z1 side), step portion (S1) is formed between insulation layer 11 and insulation layer 31. An edge of conductive layer 13 is positioned at step portion (S1). In the present embodiment, since insulation layer 11 is made of resin containing core material and insulation layer 31 is made of resin without core material, it is easy to form step portion (S1). Here, a method for forming recessed portion (1003a) is not limited to using a laser, and dry etching or the like, for example, may also be employed.

Figure 13A:
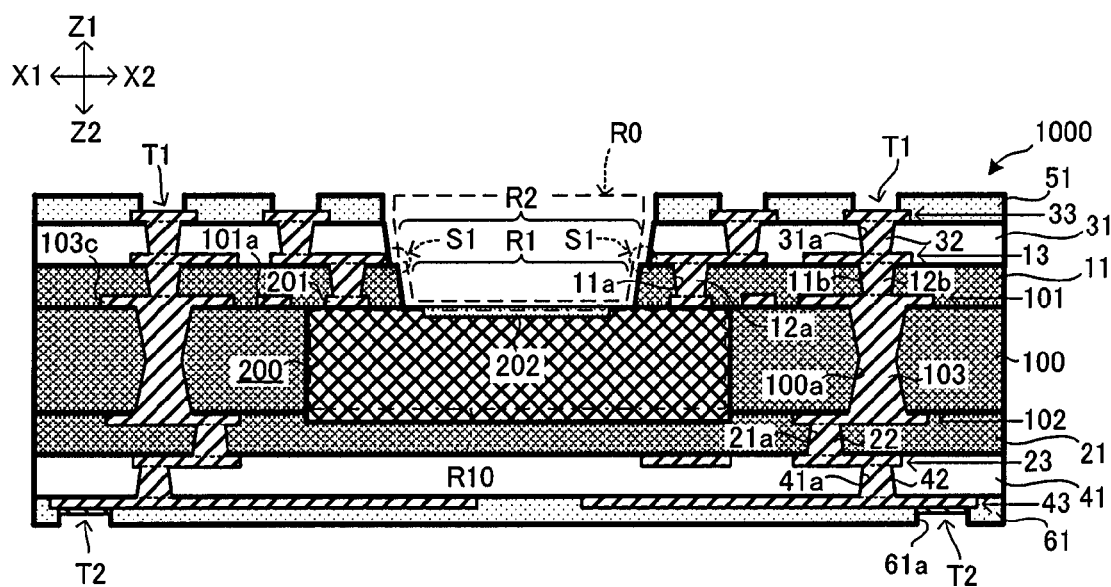
FIG. 13A is a view to illustrate a step for exposing the light receiver of the imaging element in the manufacturing method shown in FIG. 6.

In step (S15) in FIG. 6, cover portion 110 is removed manually or by adding external force using another method, for example, as shown in FIG. 13A. Accordingly, opening portion (R2) (second opening portion) connected to opening portion (R1) (first opening portion) is formed in insulation layer 31 (second insulation layer). As a result, opening portion (R0) is formed and light receiver 202 of imaging element 200 is exposed. Accordingly, wiring board 1000 (FIG. 1) is completed.

Figure 13B:
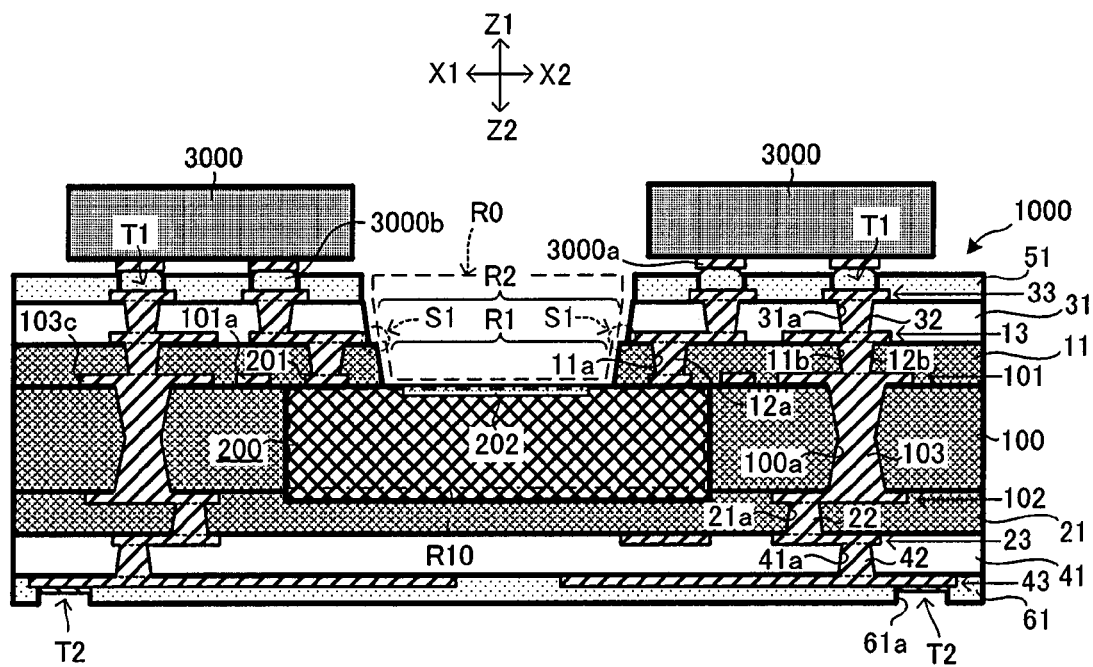
FIG. 13B is a view to illustrate a step for mounting electronic components on a wiring board with a built-in imaging element according to the first embodiment of the present invention in the manufacturing method shown in FIG. 6.

In step (S16) in FIG. 6, electronic component 3000 is mounted on wiring board 1000. Specifically, as shown in FIG. 13B, electronic component 3000 is mounted on external connection terminal (T1) through soldering, for example. Electrode (3000a) of electronic component 3000 is electrically connected to external connection terminal (T1) (pad) of wiring board 1000 via solder (3000b) (solder bump), for example.

Through the above steps, wiring board 1000 of the present embodiment (wiring board with a built-in imaging element) is manufactured. The manufacturing method according to the present embodiment is suitable for manufacturing wiring board 1000. According to such a manufacturing method, an excellent wiring board 1000 is obtained at low cost. Then, when a lens block is placed in light receiver 202 of imaging element 200, and wiring board 1000 with the lens block is mounted on motherboard 2000 (FIG. 1), an imaging device is completed.

Second Embodiment

A second embodiment of the present invention is described focusing on differences with the above first embodiment. Here, the same reference number is used for an element identical to the element shown in above FIG. 1 and others, and a common portion already described, namely, the portion whose description would be redundant, is omitted here for the purpose of convenience and simplification.

Figure 14:
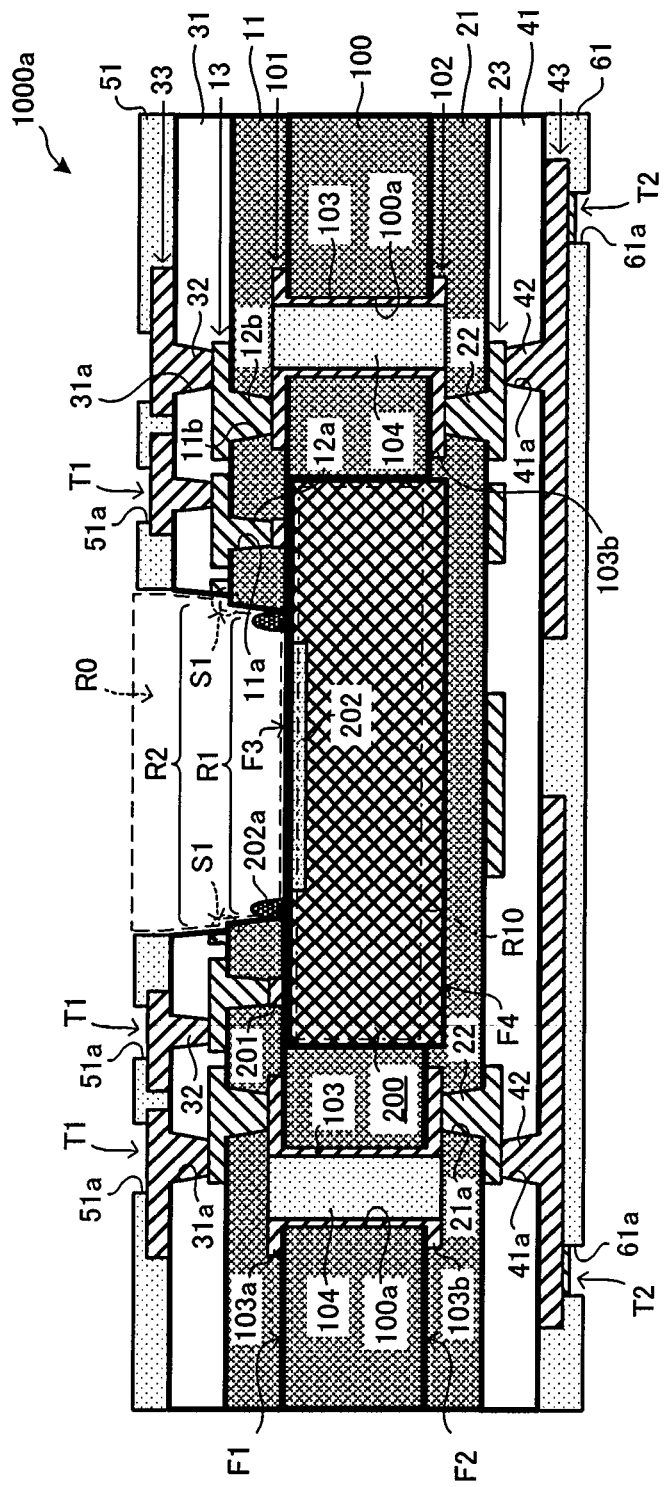
FIG. 14 is a cross-sectional view outlining a wiring board with a built-in imaging element according to a second embodiment of the present invention.

As shown in FIG. 14, through-hole conductor 103 is a conformal conductor in wiring board (1000a) of the present embodiment. For example, through-hole conductor 103 is formed by forming a conductor (such as copper plating) on the wall surface of columnar through hole (100a) and by filling insulator 104 inside. In addition, via conductors (12b, 32) and through-hole conductor 103 are not stacked.

Between light receiver 202 of imaging element 200 and insulation layer 11 (first insulation layer), wiring board (1000a) of the present embodiment has protruding portion (202a) that protrudes from first surface (F3) (sensor surface) of imaging element 200. In such a structure, contaminants from a processed surface (such as a side surface) or the like of insulation layer 11 seldom reach light receiver 202 because of protruding portion (202a) positioned between light receiver 202 and insulation layer 11 (second insulation layer). Accordingly, it is easier to prevent light receiver 202 from being contaminated.

Protruding portion (202a) is positioned adjacent to insulation layer 11 in wiring board (1000a) of the present embodiment. However, that is not the only option, and protruding portion (202a) may be separated from insulation layer 11 (see FIGS. 36A, 36B)

Protruding portion (202a) is made of resin without core material. Protruding portion (202a) is made of photosetting resin (such as UV curable resin) in a preferred example.

Figure 15A:
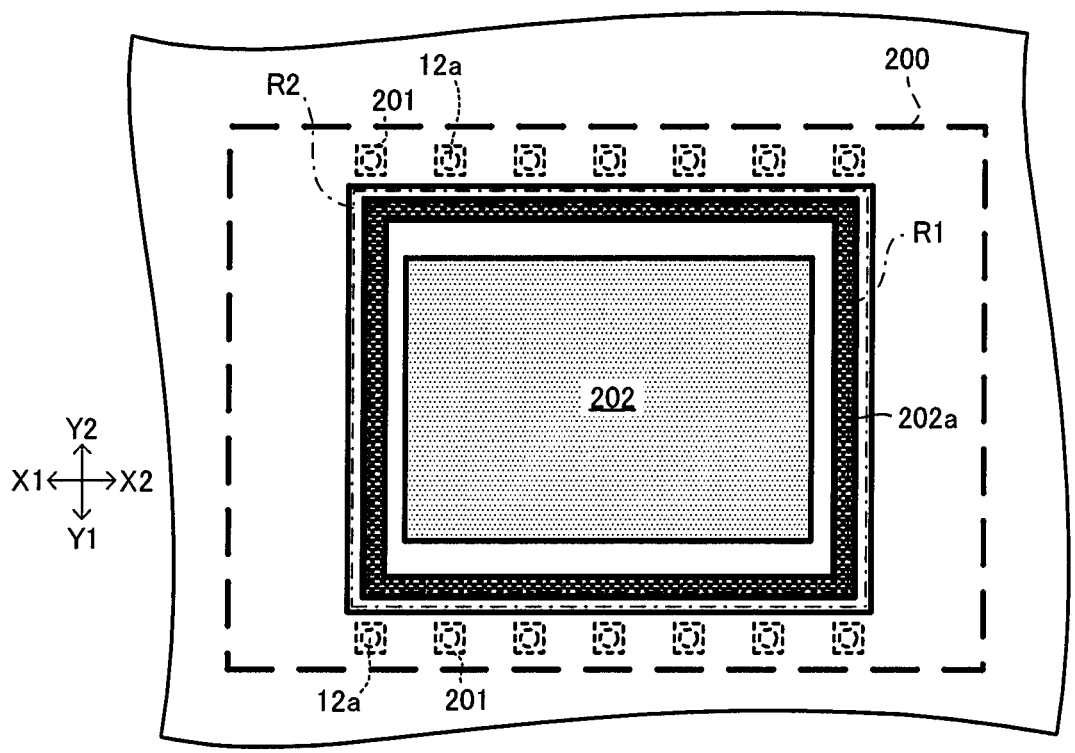
FIG. 15A is a view showing a first example of the shape of a protruding portion in a wiring board with a built-in imaging element according to the second embodiment.
Figure 15B:
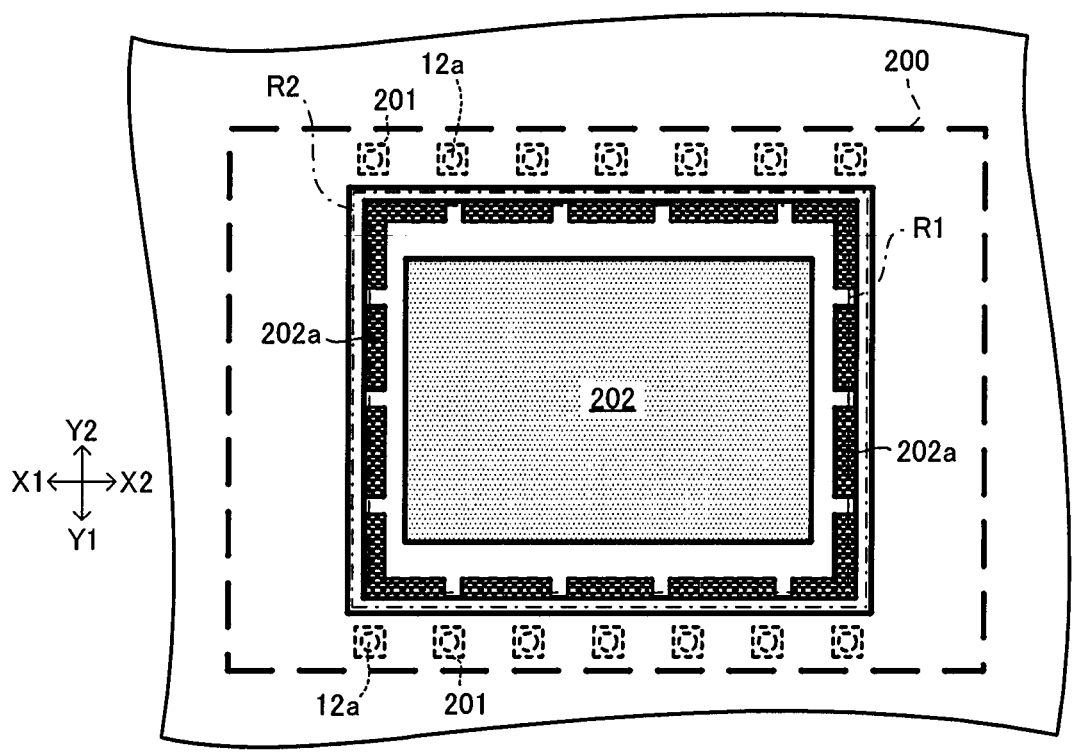
FIG. 15B is a view showing a second example of the shape of a protruding portion in a wiring board with a built-in imaging element according to the second embodiment.

In the present embodiment, light receiver 202 is surrounded by protruding portion (202a) represented by a solid line as shown in FIG. 15A. However, that is not the only option, and light receiver 202 may be surrounded by protruding portion (202a) which is represented by a dotted line and has cuts at substantially constant intervals as shown in FIG. 15B, for example. Alternatively, it is an option for light receiver 202 not to be surrounded by protruding portion (202a) (see FIGS. 38A, 38B). "Being surrounded" includes situations in which a region is completely enclosed by a solid-line ring (see FIG. 15A) as well as situations in which a region is surrounded by a dotted-line ring (see FIG. 15B). If a protruding portion exists at least in three of four directions (X1, X2, Y1, Y2) of an object, the object is "surrounded."

In the present embodiment, the height of protruding portion (202a) is less than the height of insulation layer 11 (first insulation layer) (=thickness of insulation layer 11). However, the height of protruding portion (200a) is preferred to be half or greater than half the thickness of insulation layer 11 (first insulation layer). When protruding portion (200a) is higher, it is easier to block contaminants.

Figure 16:
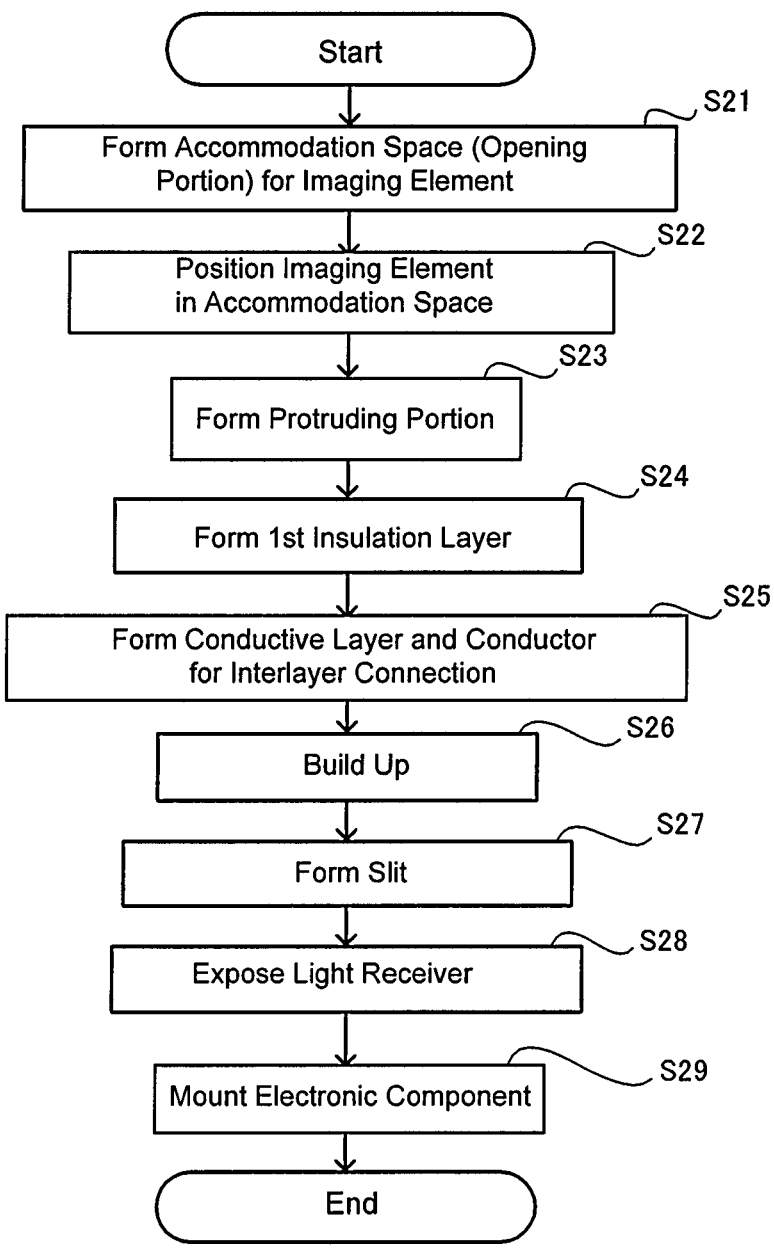
FIG. 16 is a flowchart showing a method for manufacturing a wiring board with a built-in imaging element according to the second embodiment of the present invention.

In the following, a method for manufacturing wiring board (1000a) is described by referring to FIG. 16 and others. FIG. 16 is a flowchart schematically showing the contents and order of a method for manufacturing wiring board (1000a) according to the present embodiment.

Figure 17A:
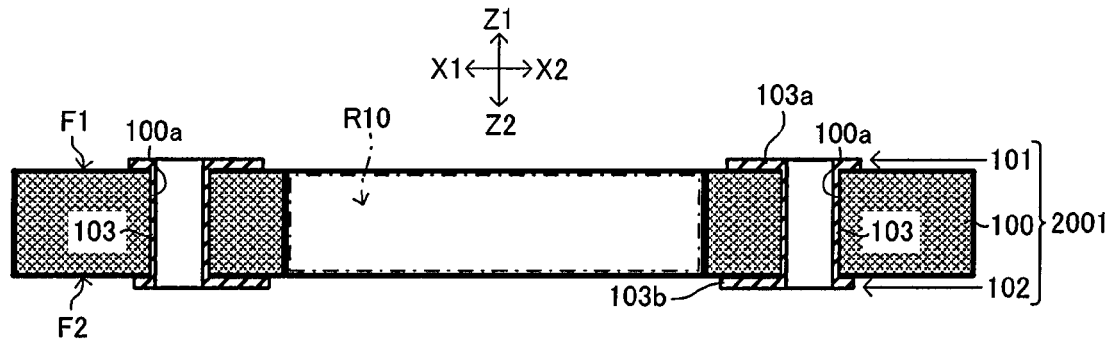
FIG. 17A is a view to illustrate a step for forming an accommodation space (opening portion) for an imaging element in a starting substrate in the manufacturing method shown in FIG. 16.

In step (S21), wiring board 2001 (starting material) is prepared as shown in FIG. 17A, and opening portion (R10) (accommodation space for imaging element 200) is formed in wiring board 2001 (in particular, substrate 100) using a laser or a drill, for example. Opening portion (R10) is made of a hole that penetrates through substrate 100.

Wiring board 2001 is a double-sided copper-clad laminate, for example. In the present embodiment, wiring board 2001 is formed with substrate 100, conductive layer 101 formed on first surface (F1) of substrate 100, conductive layer 102 formed on second surface (F2) of substrate 100, and through-hole conductor 103. Conductive layers (101, 102) each have a triple-layer structure of copper foil (lower layer), electroless copper plating (middle layer) and electrolytic copper plating (upper layer), for example. Columnar through hole (100a) is formed by a drill, for example. Then, by electroless and electrolytic copper plating, for example, performed when copper foil is formed on substrate 100 and through hole (100a) is formed in substrate 100, conductive layers (101, 102) and through-hole conductor 103 are formed.

Figure 17B:
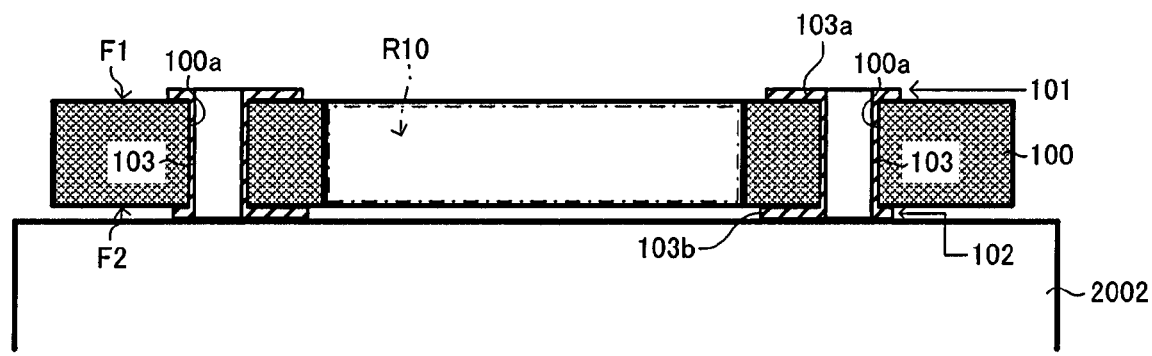
FIG. 17B is a view to illustrate a step for placing a wiring board on a carrier in the manufacturing method shown in FIG. 16.

As shown in FIG. 17B, wiring board 2001 with opening portion (R10) is placed on carrier 2002 (base). Carrier 2002 is placed on the second-surface (F2) side of substrate 100.

Figure 17C:
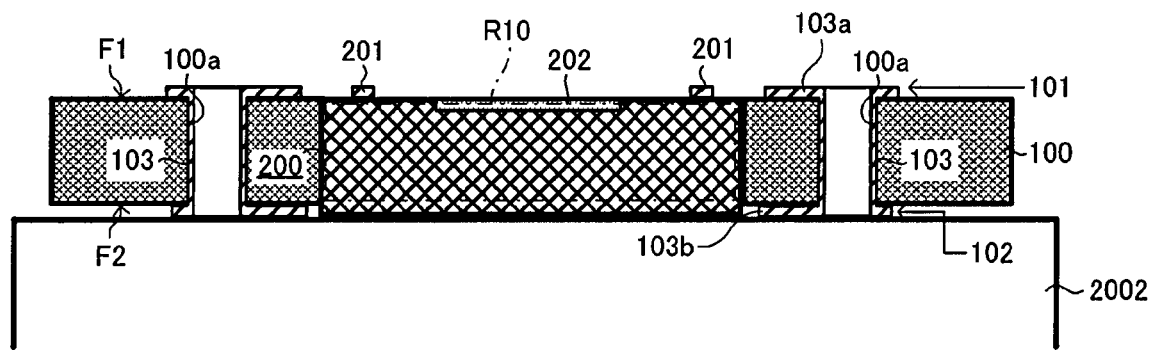
FIG. 17C is a view to illustrate a step for positioning an imaging element in the opening portion of the wiring board in the manufacturing method shown in FIG. 16.

In step (S22) in FIG. 16, imaging element 200 is positioned in opening portion (R10) of wiring board 2001 as shown in FIG. 17C.

Figure 18:
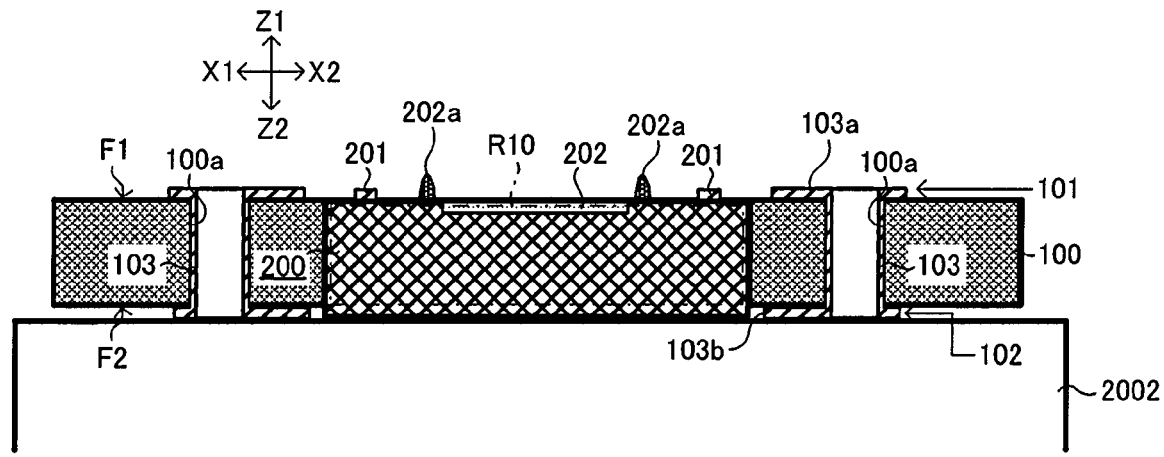
FIG. 18 is a view to illustrate a step for forming a protruding portion in the manufacturing method shown in FIG. 16.

In step (S23) in FIG. 16, protruding portion (200a) is formed outside light receiver 202 on first surface (F3) (sensor surface) of imaging element 200 as shown in FIG. 18. In particular, using a dispenser, for example, UV curable resin is formed on first surface (F3) of imaging element 200 as shown in FIG. 15A, and the resin is cured by irradiating ultraviolet rays.

In step (S24) in FIG. 16, insulation layer 11 (first insulation layer) is formed on substrate 100.

Figure 19A:
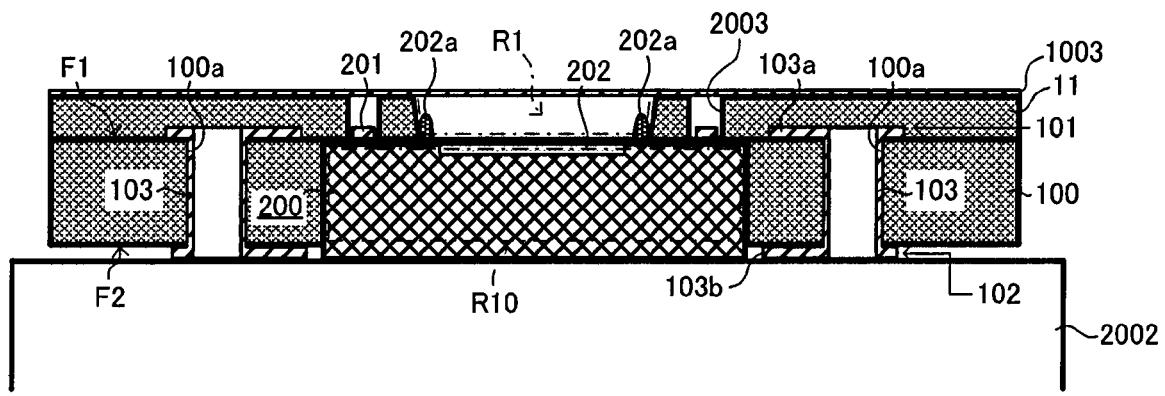
FIG. 19A is a view to illustrate a first step for forming a first insulation layer on the substrate in the manufacturing method shown in FIG. 16.

Specifically, semicured insulation layer 11 (first insulation layer) having opening portion (R1) (first opening portion) and opening portion 2003 is formed on first surface (F1) of substrate 100 as shown in FIG. 19A. Insulation layer 11 is made of thermosetting glass epoxy prepreg, for example. Then, copper foil 1003 is formed on insulation layer 11, opening portion (R1) and opening portion 2003. Insulation layer 11 is formed at the same time as copper foil 1003, for example. Opening portion (R1) is positioned on light receiver 202 as shown in FIG. 15A, for example, and opening portion 2003 is positioned on electrode 201. In the present embodiment, protruding portion (200a) is adjacent to insulation layer 11. Here, it is not always required for opening portion 2003 to be formed in insulation layer 11 (first insulation layer).

Figure 19B:
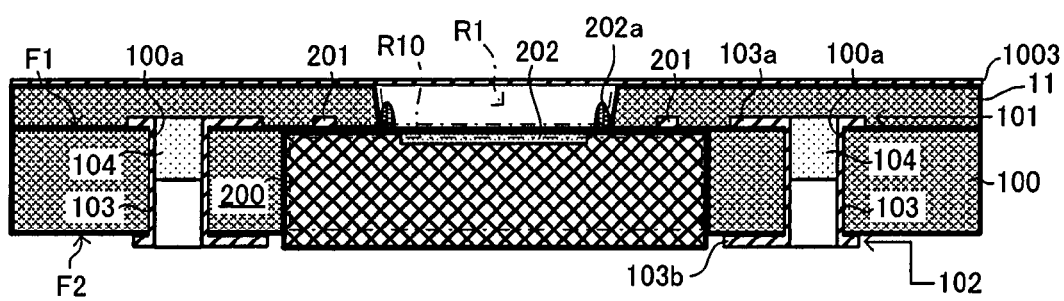
FIG. 19B is a view to illustrate a second step subsequent to the step in FIG. 19A.

Since insulation layer 11 is semicured, resin of insulation layer 11 flows out and the resin (insulator 104) is filled in the gap between substrate 100 and imaging element 200, through hole (100a) and opening portion 2003 as shown in FIG. 19B. Accordingly, conductive layer 101 and electrode 201 are covered by insulation layer 11.

Insulator 104 as filled above and imaging element 200 are preliminarily adhered. In particular, insulator 104 is heated so as to gain retention power to a degree it can support imaging element 200. By doing so, imaging element 200 supported by carrier 2002 is supported by substrate 100. Then, carrier 2002 is removed from the wiring board. In addition, the wiring board is cleansed if required.

Figure 20:
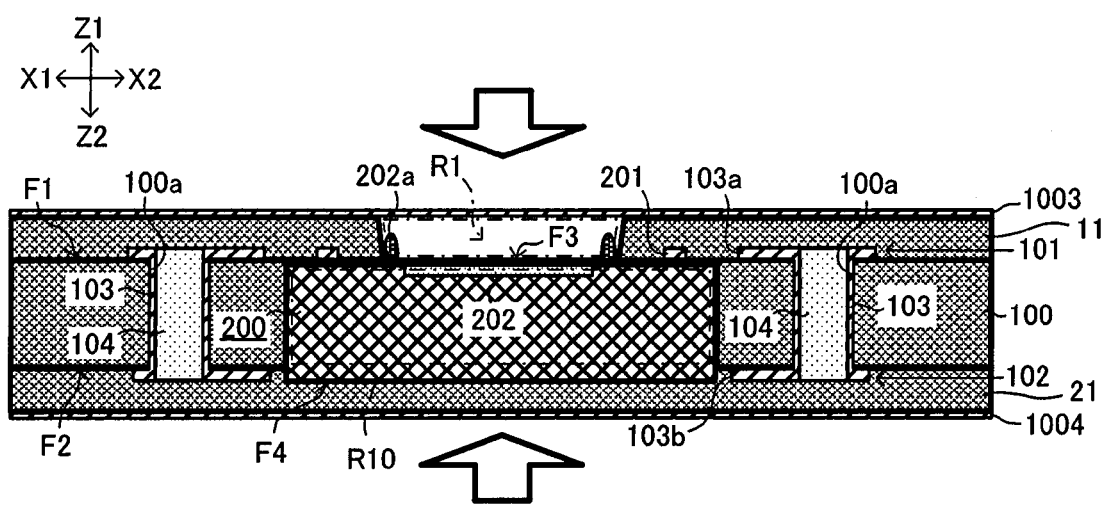
FIG. 20 is a view to illustrate a third step subsequent to the step in FIG. 19B.

Insulation layer 21 is formed on second surface (F2) of substrate 100 and second surface (F4) of imaging element 200 as shown in FIG. 20. Accordingly, conductive layer 102 is covered by insulation layer 21. Insulation layer 21 is made of thermosetting glass epoxy prepreg, for example. Also, copper foil 1004 is formed on insulation layer 21. Insulation layer 21 is formed at the same time as copper foil 1004, for example. In the present embodiment, opening portion (R1) is left vacant, but a strip mask may be arranged in opening portion (R1) prior to forming copper foil 1003. By covering light receiver 202 with a strip mask, it is easier to prevent light receiver 202 from being contaminated.

Insulation layers (11, 21) are pressed while they are semicured (prepreg), and heated so that insulation layers (11, 21) are each cured. Accordingly, resin from insulation layers (11, 21) are flowed out and such resin (insulator 104) is filled in the gap between substrate 100 and imaging element 200 and in through hole (100a). Insulation layers (11, 21) are simultaneously cured in the present embodiment. However, that is not the only option, and insulation layers (11, 21) may be cured separately.

In step (S25) in FIG. 16, conductive layers and conductors (via conductors) for interlayer connections are formed.

Figure 21:
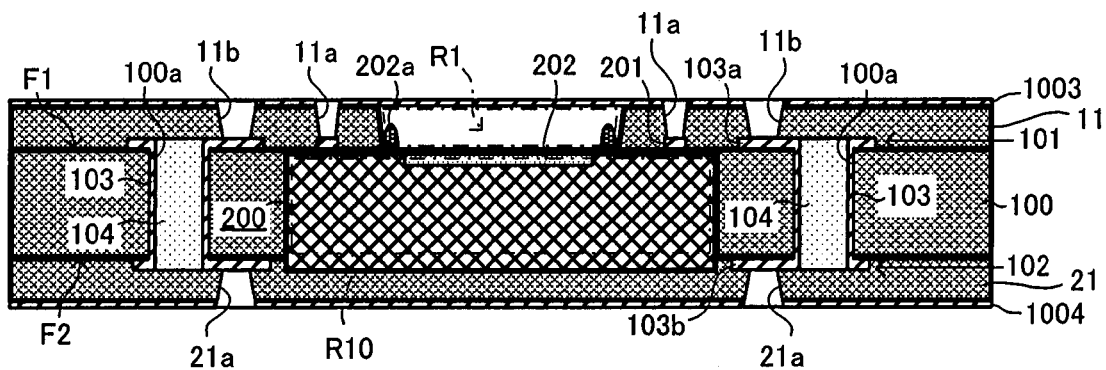
FIG. 21 is regarding a first insulation layer in the manufacturing method shown in FIG. 16, a view to illustrate a first step for forming a conductive layer and a conductor for interlayer connection.

Specifically, as shown in FIG. 21, a $CO_2$ laser or UV laser or a combination of those, for example, is used to form holes (11a, 11b) (via holes) in insulation layer 11, and hole (21a) (via hole) in insulation layer 21. Then, desmearing is conducted if required.

Figure 22A:
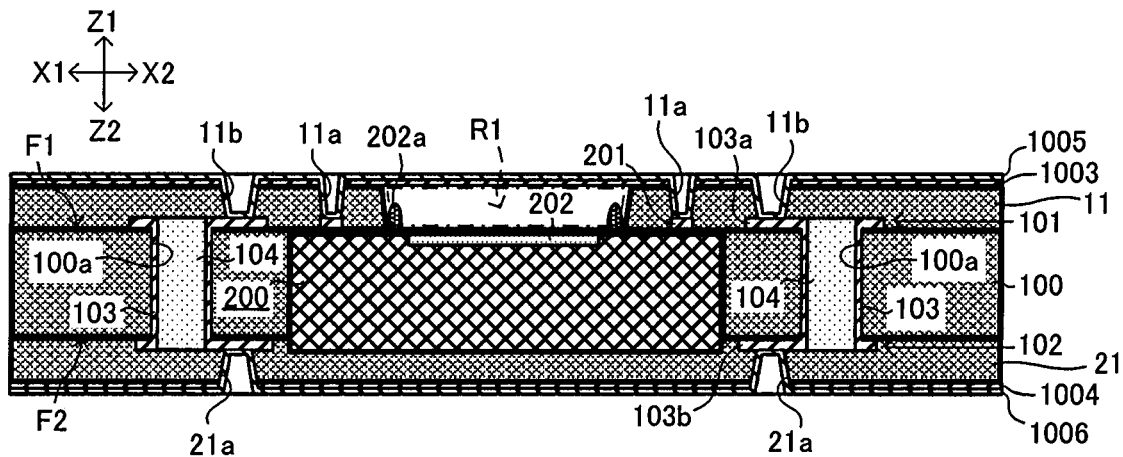
FIG. 22A is a view to illustrate a second step subsequent to the step in FIG. 21.

As shown in FIG. 22A, a panel plating method, for example, is used to form electroless copper-plated film 1005 on copper foil 1003 and in holes (11a, 11b), and electroless copper-plated film 1006 on copper foil 1004 and in hole (21a).

Figure 22B:
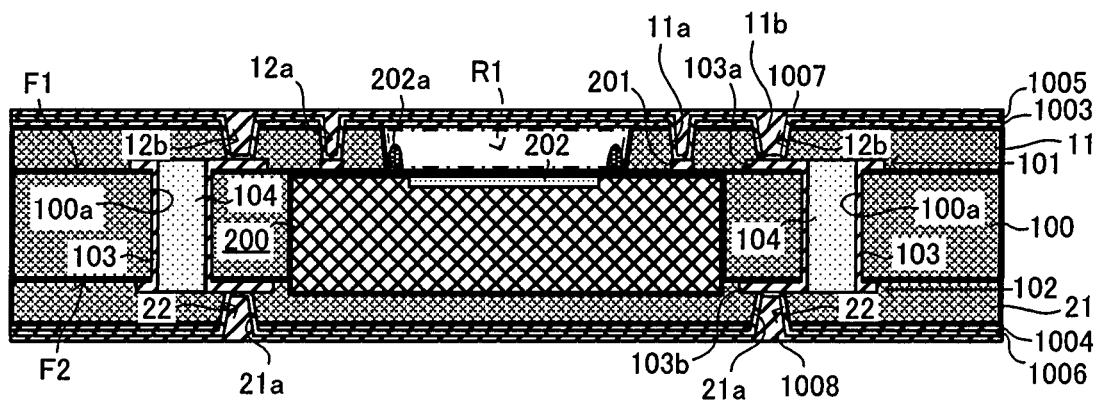
FIG. 22B is a view to illustrate a third step subsequent to the step in FIG. 22A.

As shown in FIG. 22B, electrolytic plating is performed using electroless plated films (1005, 1006) as a seed, for example, to form electrolytic copper plating 1007 on electroless plated film 1005, and electrolytic copper plating 1008 on electroless plated film 1006. Accordingly, conductor (such as copper plating) is each filled in holes (11a, 11b, 21a) so that via conductors (12a, 12b, 22) are formed.

Figure 22C:
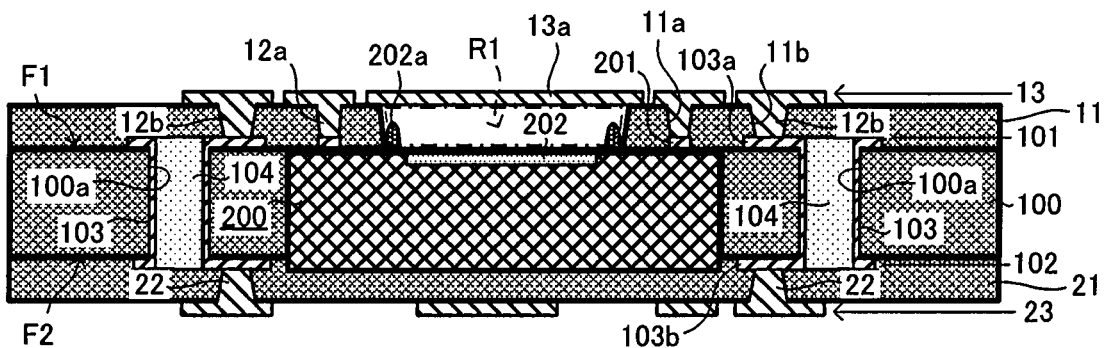
FIG. 22C is a view to illustrate a fourth step subsequent to the step in FIG. 22B.

Etching using etching resist with a predetermined pattern, for example, is performed to pattern the conductive layer on each surface as shown in FIG. 22C. Accordingly, conductive layer 13 and conductive pattern (13a) are formed on insulation layer 11, and conductive layer 23 is formed on insulation layer 21. Conductive pattern (13a) is shaped to be substantially planar, for example (see FIG. 11, for example).

In step (S26) in FIG. 16, buildup is conducted on each main surface of the wiring board.

Specifically, insulation layer 31 and copper foil 1009 (resin-coated copper foil, for example) are formed on insulation layer 11, and insulation layer 41 and copper foil 1010 (resin-coated copper foil, for example) are formed on insulation layer 21. Insulation layers (31, 41) are each made of epoxy resin, for example.

Figure 23A:
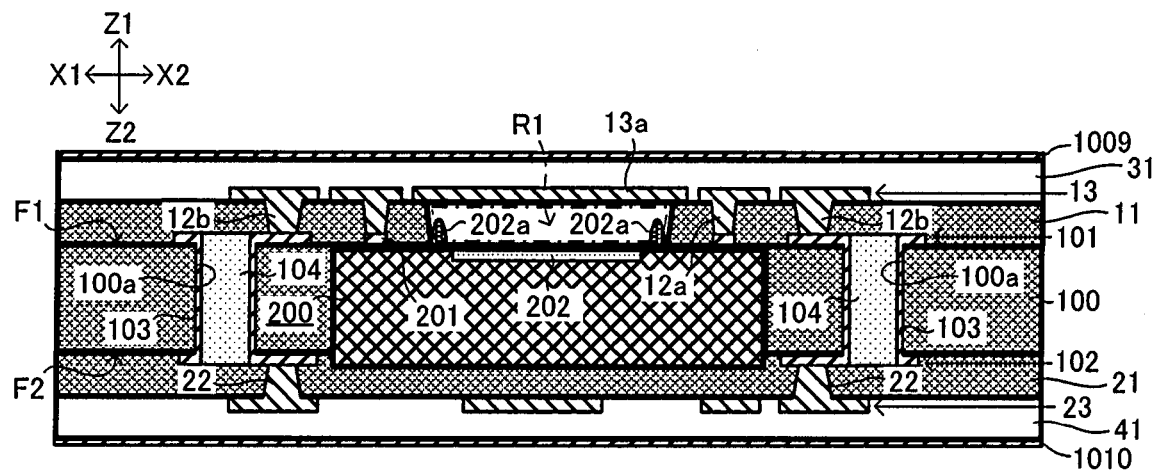
FIG. 23A is a view to illustrate a step for forming a second insulation layer in the manufacturing method shown in FIG. 16.
Figure 23B:
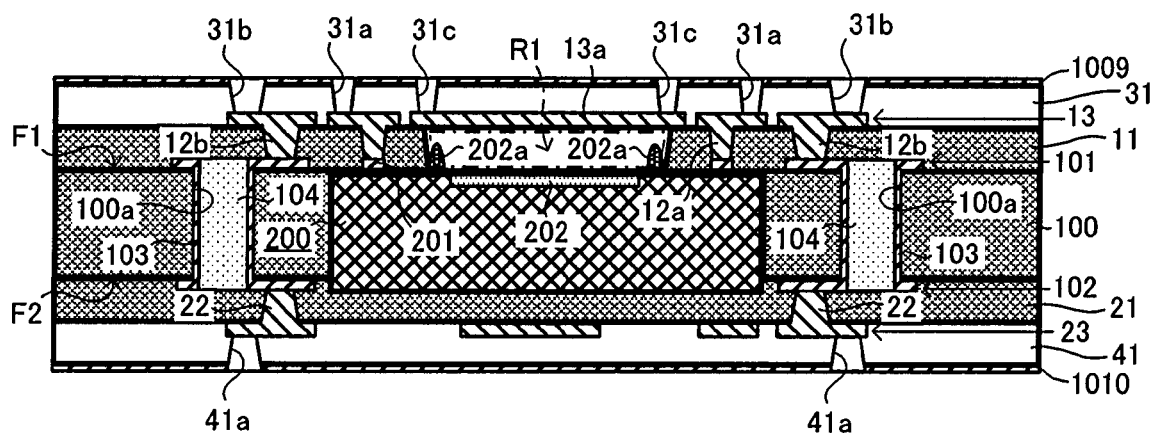
FIG. 23B relates to a second insulation layer in the manufacturing method shown in FIG. 16, and is a view to illustrate a first step for forming a conductive layer and a conductor for interlayer connection.

A laser, for example, is used to form holes (31a, 31b, 31c) (via holes) in insulation layer 11 and hole (41a) (via hole) in insulation layer 41 as shown in FIG. 23B. Here, holes (31a, 31b, 31c) respectively reach the conductive pattern (conductive layer 13) electrically connected to electrode 201, the conductive pattern (conductive layer 13) electrically connected to conductive layer 101, and conductive pattern (13a). Also, hole (41a) reaches the conductive pattern (conductive layer 23) electrically connected to conductive layer 102. Since hole (31c) forms later-described recessed portion (1003a) (see FIG. 26A), it is positioned near the boundary of opening portion (R1) and insulation layer 11. Then, desmearing is conducted if required.

Figure 23C:
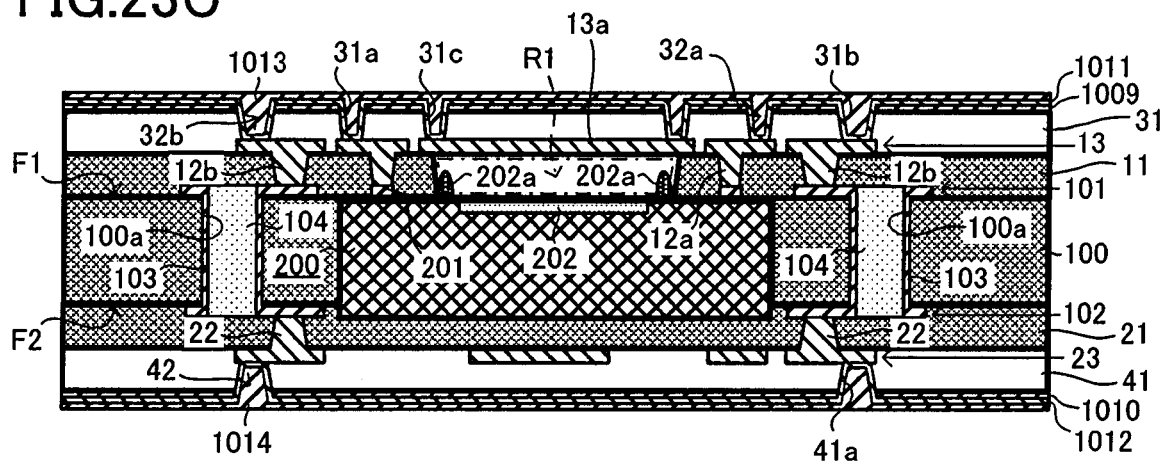
FIG. 23C is a view to illustrate a second step subsequent to the step in FIG. 23B.

As shown in FIG. 23C, a panel-plating method, for example, is used to form electroless copper-plated film 1011 on copper foil 1009 and in holes (31a, 31b, 31c) and electroless copper-plated film 1012 on copper foil 1010 and in hole (41a). Then, electrolytic plating using electroless plated films (1011, 1012) as a seed, for example, is performed to form electrolytic copper plating 1013 on electroless plated film 1011 and electrolytic copper plating 1014 on electroless plated film 1012. Accordingly, conductor (copper plating, for example) is filled in holes (31a, 31b, 41a) respectively so that via conductors (32a, 32b, 42) are formed.

Figure 24A:
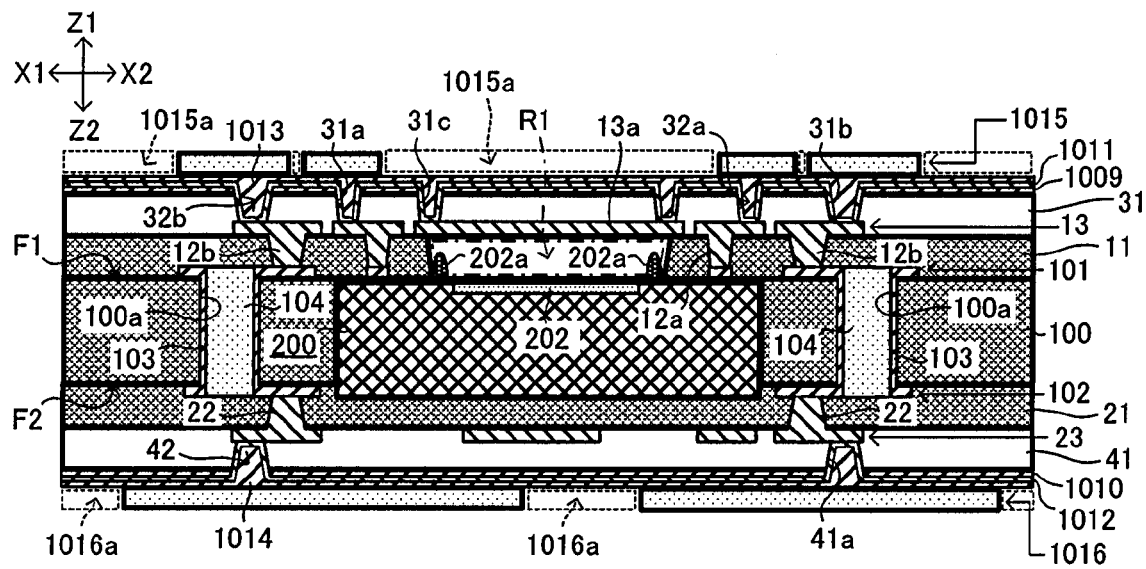
FIG. 24A is a view to illustrate a third step subsequent to the step in FIG. 23C.
Figure 24B:
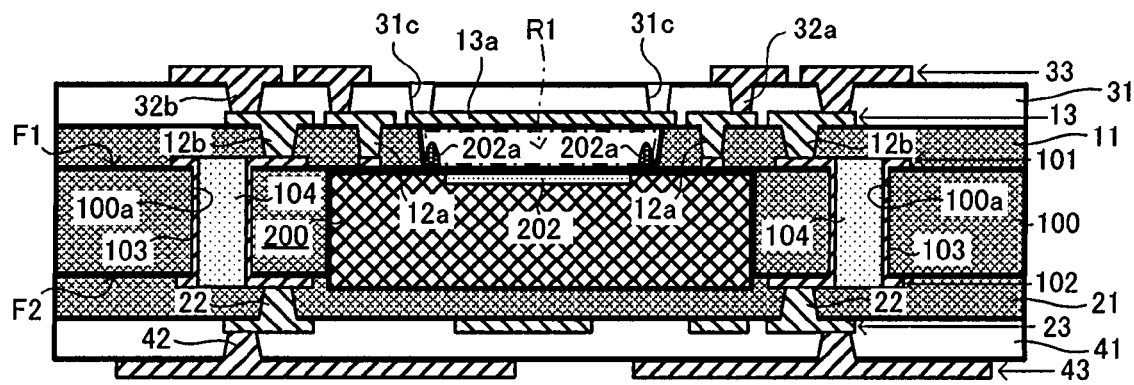
FIG. 24B is a view to illustrate a fourth step subsequent to the step in FIG. 24A.

As shown in FIG. 24A, for example, etching resist 1015 with opening portion (1015a) is formed on electrolytic plating 1013, and etching resist 1016 with opening portion (1016a) is formed on electrolytic plating 1014. Then, the conductive layer on each surface is patterned by etching as shown in FIG. 24B. After that, etching resists (1015, 1016) are removed. Accordingly, conductive layer 33 is formed on insulation layer 31, and conductive layer 43 is formed on insulation layer 41.

Figure 25:
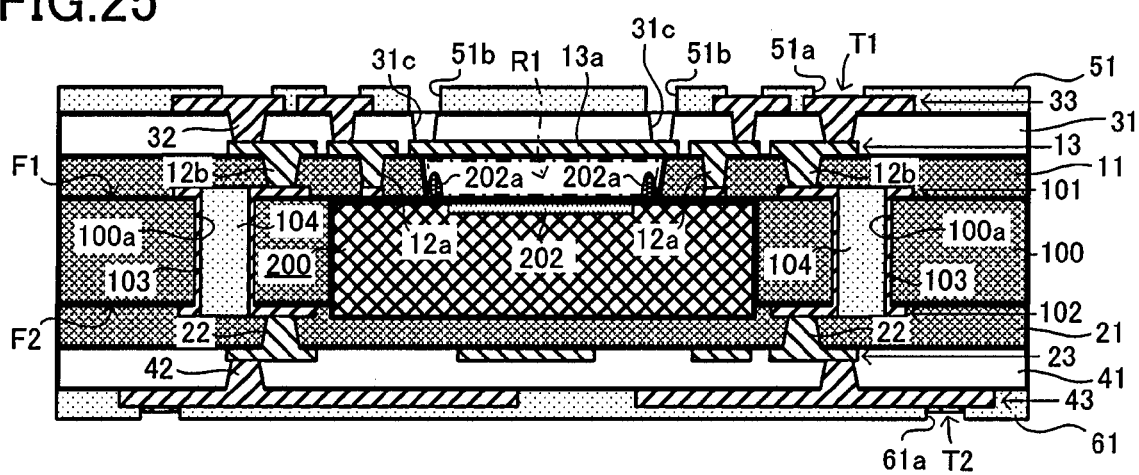
FIG. 25 is a view to illustrate a step for forming solder resists in the manufacturing method shown in FIG. 16.

As shown in FIG. 25, for example, solder resist 51 with opening portions (51a, 51b) and solder resist 61 with opening portion (61a) are formed respectively on insulation layers (31, 41). Opening portion (51a) is positioned on external connection terminal (T1), opening portion (51b) on hole (31c), and opening portion (61a) on external connection terminal (T2). Solder resists (51, 61) are formed by screen printing, spray coating, roll coating, lamination or the like, for example. After that, Ni/Au film (anticorrosion metal film) is formed on surfaces of external connection terminals (T1, T2) by electrolytic plating or sputtering, for example, if required. Alternatively, instead of forming such film, an OSP treatment may be conducted on surfaces of external connection terminals (T1, T2).

Figure 26A:
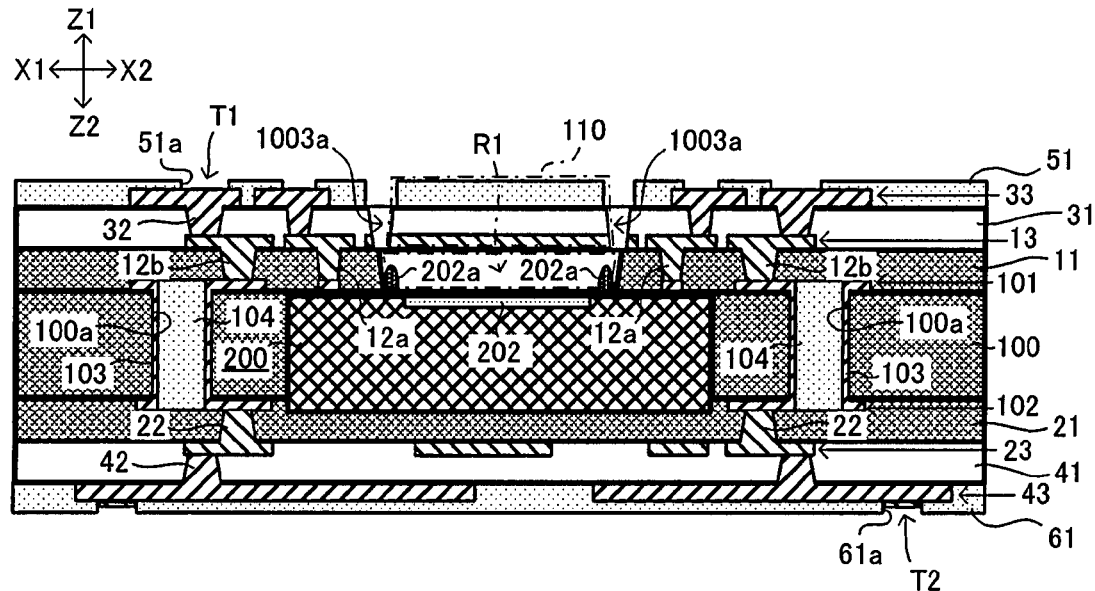
FIG. 26A is a view to illustrate a step for forming a slit in the manufacturing method shown in FIG. 16.

In step (S27) in FIG. 16, recessed portion (1003a) (slit) is formed to penetrate through insulation layer 31 and reach insulation layer 11 by etching conductive layer 13 through hole (31c) as shown in FIG. 26A, for example. Since etching is conducted from a surface of the wiring board (the Z1-side main surface), step portion (S1) is formed between insulation layer 11 and insulation layer 31. An edge of conductive layer 13 is positioned at step portion (S1). The methods for forming recessed portion (1003a) are not limited to etching, and a laser or the like may also be used, for example.

Recessed portion (1003a) is a groove to be formed continuously along the entire circumference of opening portion (R1), for example. However, how to form recessed portion (1003a) (shape, dimensions or the like) is not limited specifically as long as opening portion (R0) is formed.

By forming recessed portion (1003a), insulation layer 11, conductive pattern (13a), insulation layer 31 and solder resist 51, which are positioned on opening portion (R1), are cut out from their surroundings. Hereinafter, the portion that is cut out is referred to as cover portion 110.

Figure 26B:
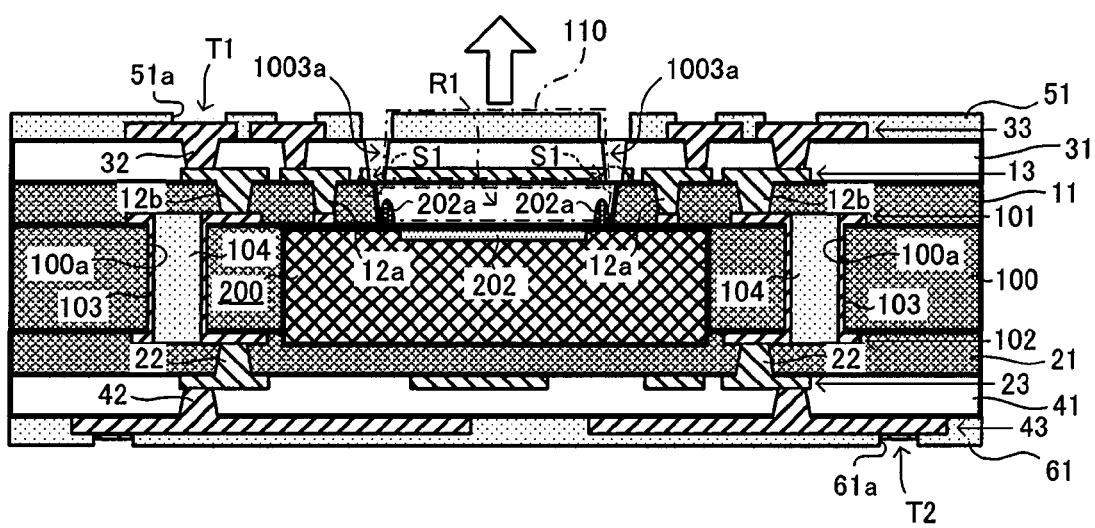
FIG. 26B is a view to illustrate a step for exposing the light receiver of the imaging element in the manufacturing method shown in FIG. 16.

In step (S28) in FIG. 16, cover portion 110 is removed by adding force manually or by other methods, for example, as shown in FIG. 26B. Accordingly, opening portion (R2) (second opening portion) is formed in insulation layer 31 (second insulation layer) to be contiguous to opening portion (R1) (first opening portion). As a result, opening portion (R0) is formed to expose light receiver 202 of imaging element 200. Then, wiring board (1000a) (FIG. 14) is completed.

In step (S29) in FIG. 6, an electronic component is mounted on wiring board (1000a).

Through the process described so far, wiring board (1000a) (wiring board with a built-in imaging element) of the present embodiment is manufactured. In addition, when a lens block is arranged on light receiver 202 of imaging element 200 and wiring board (1000a) with such a lens block is mounted on a motherboard, an imaging device is completed.

In the manufacturing method according to the present embodiment, forming protruding portion (200a) (step S23) is conducted before forming insulation layer 11 (first insulation layer) (step S24). Therefore, contaminants from a processed surface (a side surface, for example) or the like of insulation layer 11, generated while insulation layer 11 is formed and processed, are blocked by protruding portion (200a) and seldom reach light receiver 202. As a result, it is easier to prevent light receiver 202 from being contaminated.

Regarding the structures and treatments the same as those in the first embodiment, substantially the same effects described above in the first embodiment are also achieved in the present embodiment.

So far, a wiring board with a built-in imaging element and its manufacturing method according to the embodiments of the present invention have been described. However, the present invention is not limited to the above embodiments.

Figure 27A:
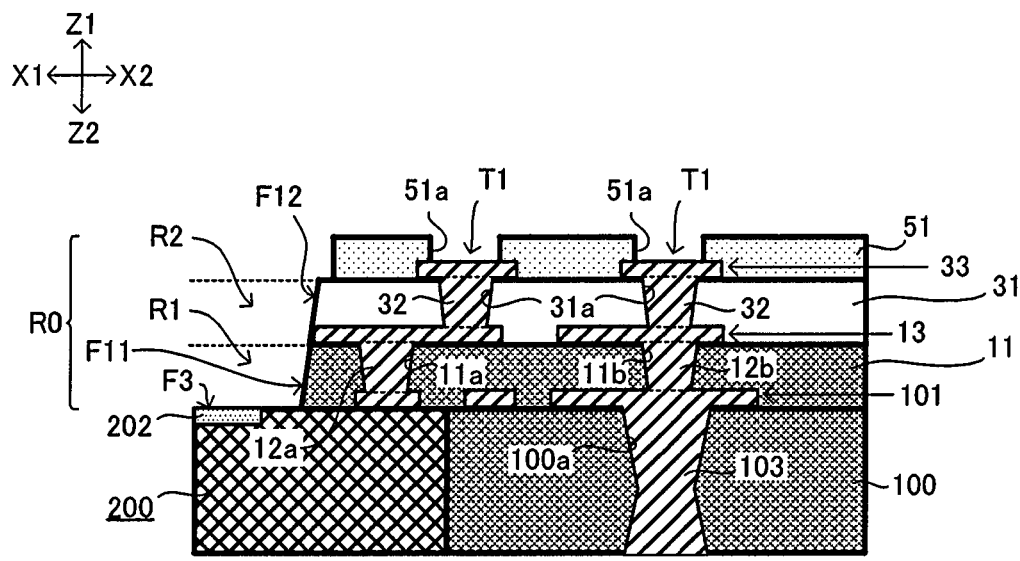
FIG. 27A is, in yet another embodiment of the present invention, a view showing a first example in which a step portion is not formed in a wiring board with a built-in imaging element.
Figure 27B:
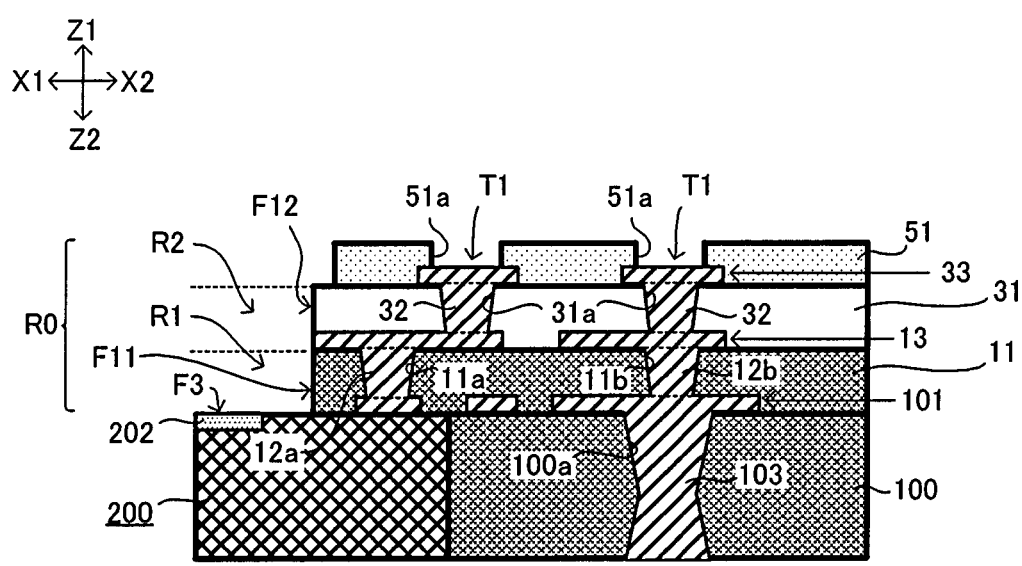
FIG. 27B is, in yet another embodiment of the present invention, a view showing a second example in which a step portion is not formed in a wiring board with a built-in imaging element.

Step portion (S1) is not always required to be formed. For example, as shown in FIGS. 27A and 27B, side surface (F11) of insulation layer 11 and side surface (F12) of insulation layer 31 may be positioned on the same plane. In the example in FIG. 27A, side surfaces (F11) and (F12) make a sloped surface inclined against first surface (F3) (sensor surface) of imaging element 200; and in the example in FIG. 27B, side surfaces (F11) and (F12) make a surface perpendicular to first surface (F3) of imaging element 200. In addition, the angle between first surface (F3) of imaging element 200 and the plane made by side surfaces (F11) and (F12) is not limited to being an obtuse angle or a right angle, and may be an acute angle as shown in FIG. 28A.

Figure 28A:
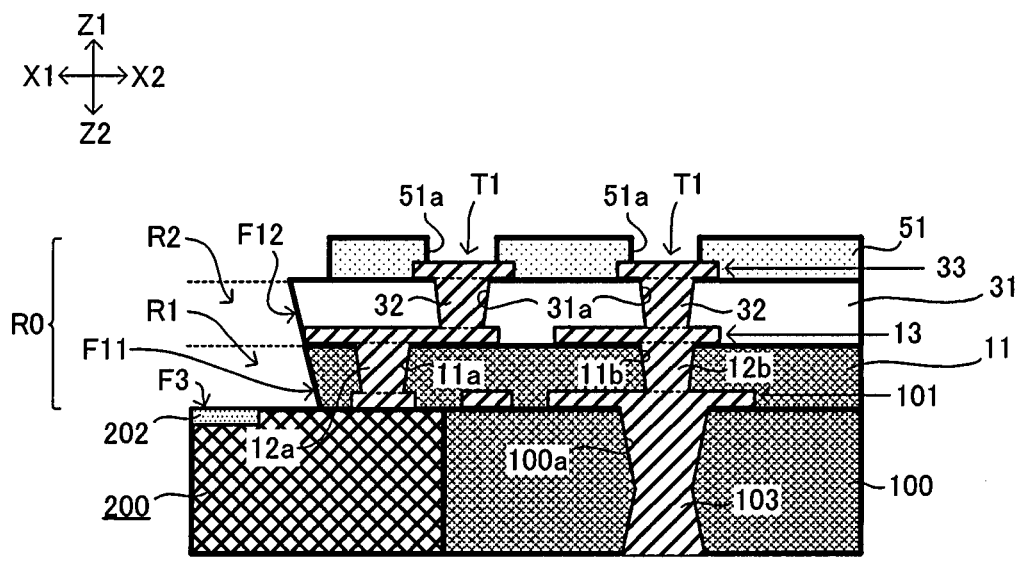
FIG. 28A is, in yet another embodiment of the present invention, a view showing a first example in which an opening portion in a second insulation layer has a smaller width than an opening portion in a first insulation layer.
Figure 28B:
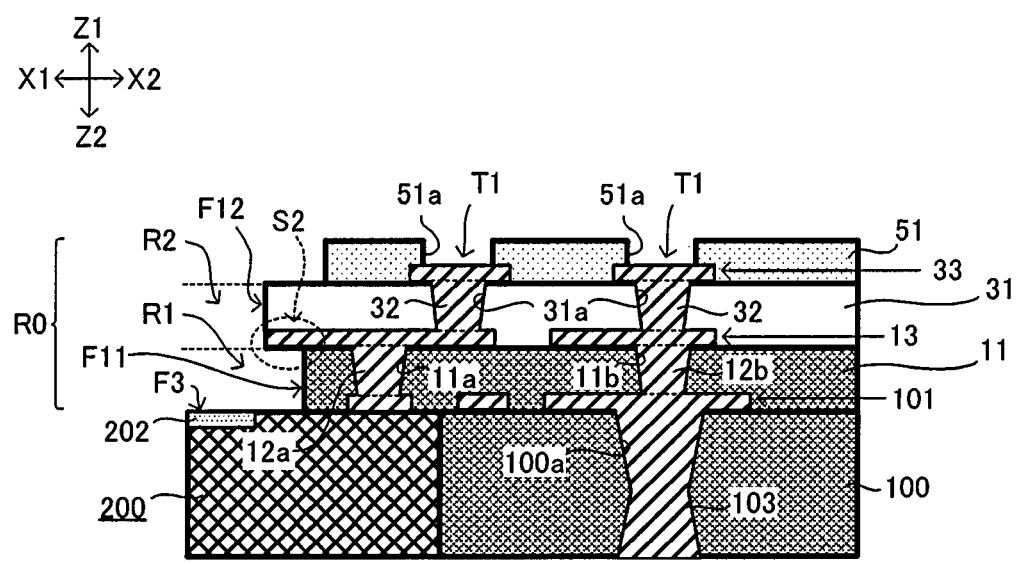
FIG. 28B is, in yet another embodiment of the present invention, a view showing a second example in which an opening portion in a second insulation layer has a smaller width than an opening portion in a first insulation layer.

As shown in FIGS. 28A and 28B, opening portion (R2) may have a smaller width than opening portion (R1). In the example in FIG. 28A, side surface (F11) of insulation layer 11 and side surface (F12) of insulation layer 31 are on the same plane. On the other hand, in the example in FIG. 28B, an edge of insulation layer 11 and an edge of insulation layer 31 are formed to make a step, and step portion (S2) is formed to be the reverse of step (S1) (FIG. 3A) between insulation layer 11 and insulation layer 31. In such a case, side surface (F12) of insulation layer 31 is positioned closer to light receiver 202 than is side surface (F11) of insulation layer 11 positioned underneath insulation layer 31. Namely, side surface (F12) of insulation layer 31 protrudes more toward light receiver 202 than does side surface (F11) of insulation layer 11. Accordingly, since the position of side surface (F11) is shifted from the position of side surface (F12), step portion (S2) is formed between insulation layer 11 and insulation layer 31.

Figure 29:
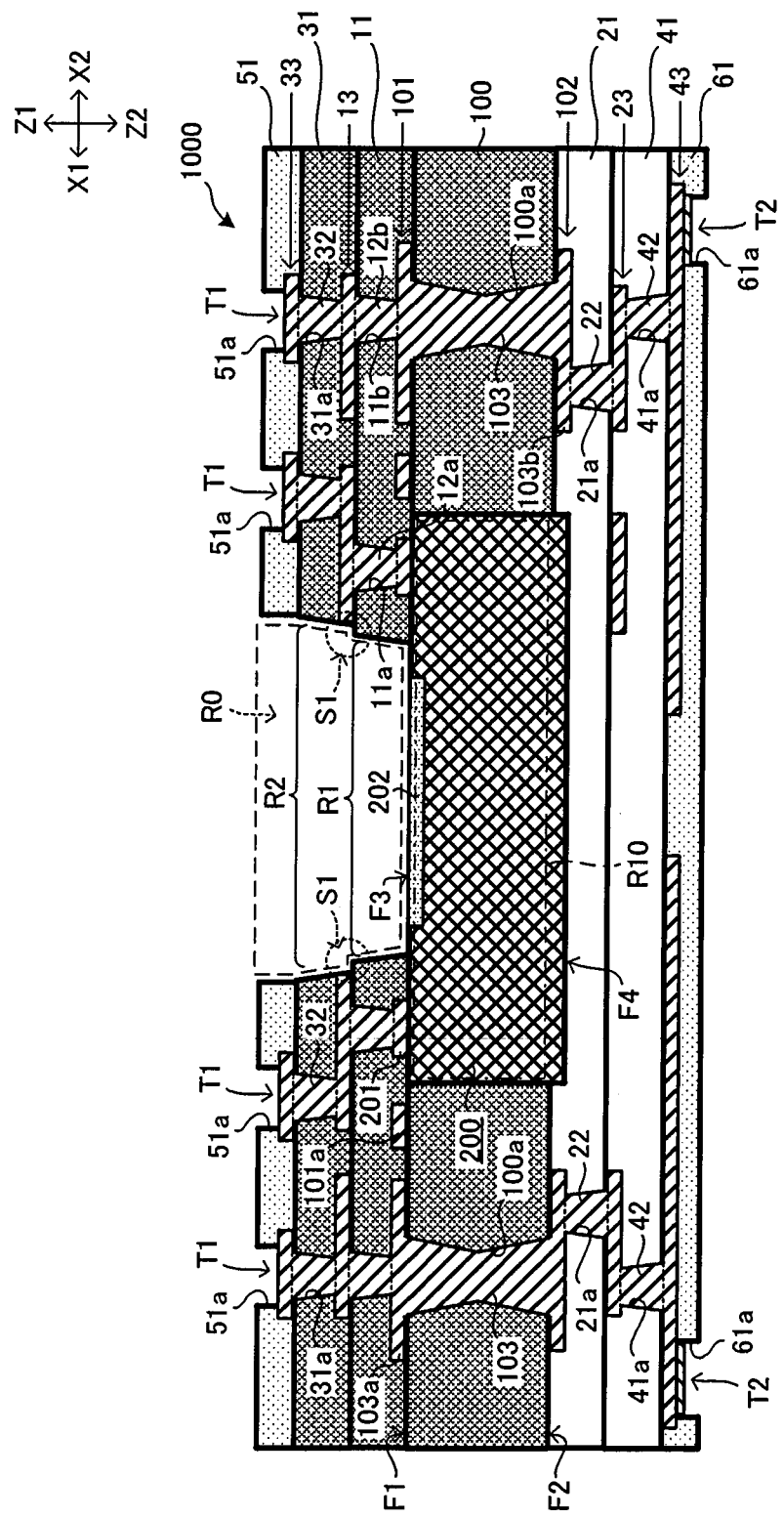
FIG. 29 is, in yet another embodiment of the present invention, a view showing an example in which an insulation layer on the side of the opening portion (first-surface side) contains core material, and an insulation layer on the opposite side (second-surface side) does not contain core material.

In the above embodiments, a wiring board is shown, where insulation layers (11, 21) are each made of resin containing core material and insulation layers (31, 41) are each made of resin without core material. However, wiring board 1000 is not limited to such. For example, as shown in FIG. 29, it may be a wiring board where insulation layers (11, 31) are each made of resin containing core material and insulation layers (21, 41) are each made of resin without core material. Accordingly, by adjusting thermal expansion coefficients in insulation layers depending on whether or not core material is contained, warping is suppressed from occurring due to differences in thermal stress between the side where opening portion (R0) is formed (first surface (F1)) and its opposite side (second surface (F2)). Also, when insulation layers (21, 41) contain less core material than insulation layers (11, 31), the effect on reducing warping is achieved.

Figure 30A:
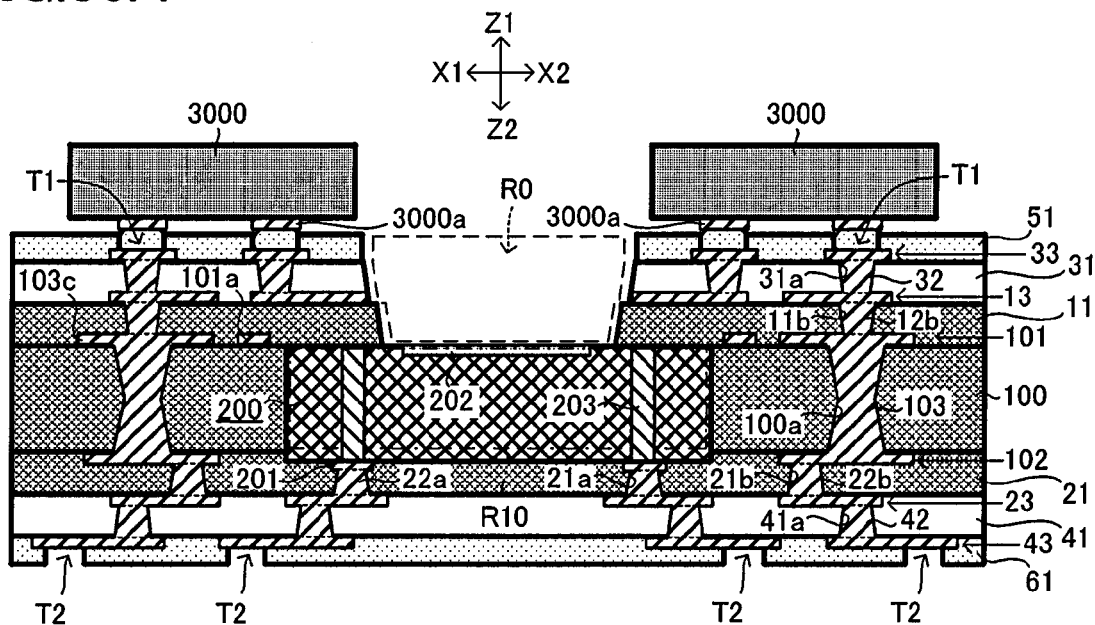
FIG. 30A is, in yet another embodiment of the present invention, a view showing an example in which an imaging element having an electrode on one main surface and a light receiver on the other main surface is built into a wiring board with a built-in imaging element.

As shown in FIG. 30A, imaging element 200 may have light receiver 202 on the side opposite electrode 201. Imaging element 200 shown in FIG. 30A has TSV (through silicon via) 203 along with light receiver 202 on one side and electrode 201 on the other side. Then, electrode 201 and light receiver 202 are electrically connected to each other via TSV 203. In addition, holes (21a, 21b) (via holes) are formed in insulation layer 21, and by filling conductor (such as copper plating) respectively in holes (21a, 21b), conductors in holes (21a, 21b) become via conductors (22a, 22b) (filled conductors) respectively. Then, electrode 201 and external connection terminal (T2) are electrically connected to each other through via conductors (22a, 42), and through-hole conductor 103 and external connection terminal (T2) are electrically connected to each other through via conductors (22b, 42).

Figure 30B:
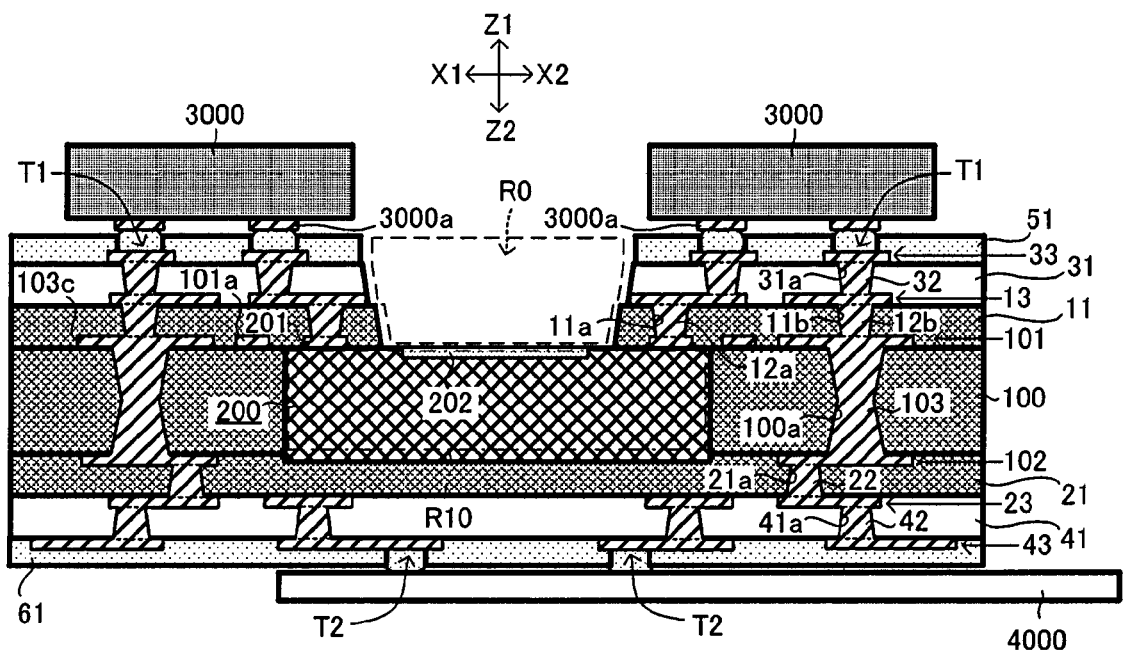
FIG. 30B is, in yet another embodiment of the present invention, a view showing an example in which a flexible wiring board is electrically connected to a wiring board with a built-in imaging element.

In the above embodiments, a motherboard is connected to external connection terminal (T2). However, a wiring board other than a motherboard may be connected to external connection terminal (T2). For example, as shown in FIG. 30B, external connection terminal (T2) of a wiring board with a built-in imaging element may be electrically connected to an external connection terminal of flexible wiring board 4000. They may be connected by soldering, for example.

Figure 31:
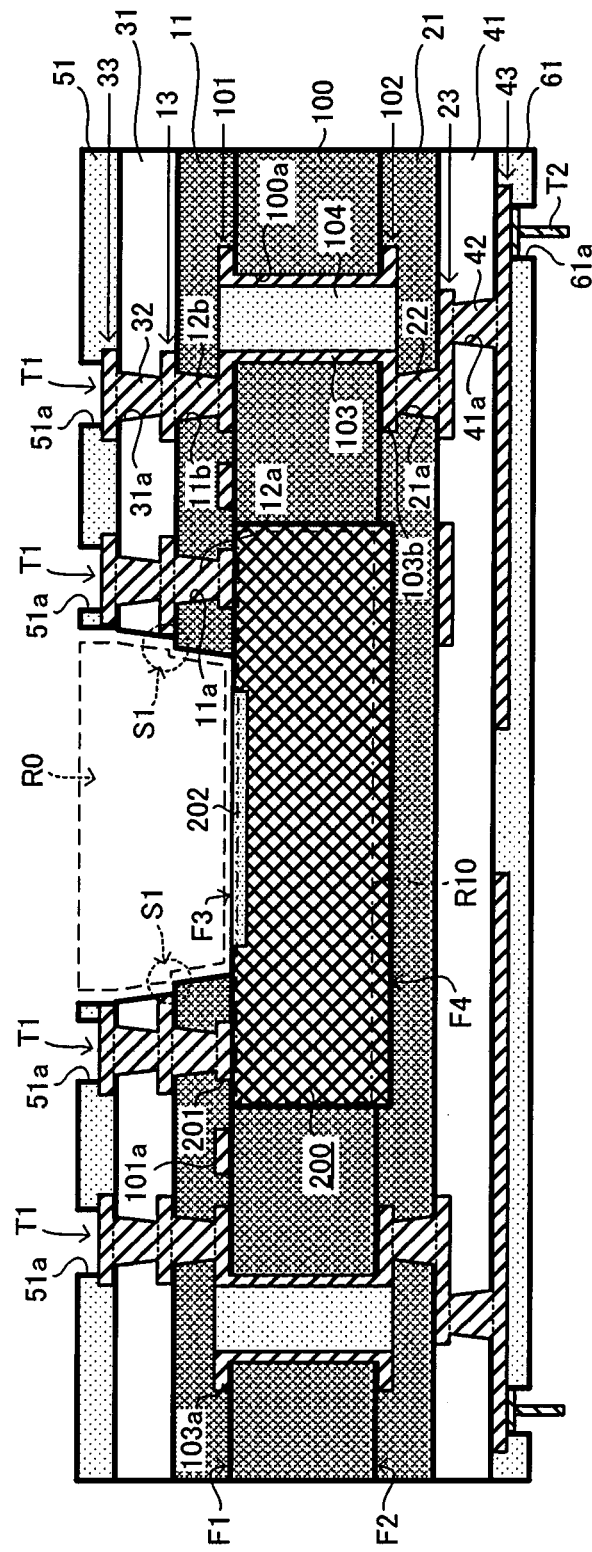
FIG. 31 is, in yet another embodiment of the present invention, a view showing an example in which a through-hole conductor and a via conductor are not stacked.

As shown in FIG. 31, external connection terminal (T2) may be a pin.

Opening portions (R0, R1, R2, R10) are not limited to being holes, and they may be grooves, notches, slits or the like.

The position of light receiver 202 is not limited to the central portion of imaging element 200, and may be in any other position. For example, light receiver 202 may be positioned closer to any of the four sides of imaging element 200.

Figure 32A:
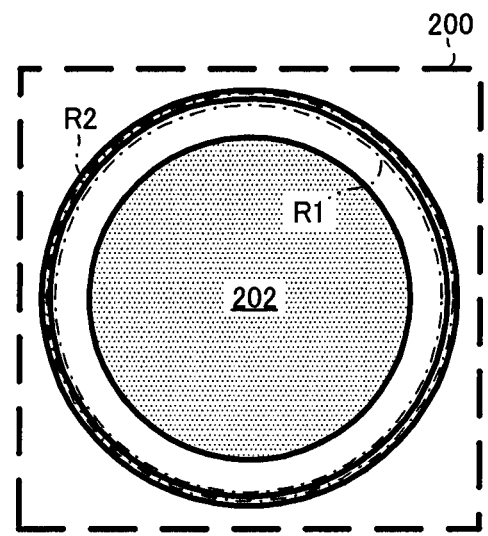
FIG. 32A is, in yet another embodiment of the present invention, a view showing an example of how a light receiver, an opening portion in the first insulation layer and an opening portion in the second insulation layer are shaped.

The shape of light receiver 202 and the shape of horizontal cross sections (X-Y plane) of opening portions (R1, R2) are not limited to being substantially rectangular, and may be any other shape. The shape of those surfaces may be substantially circular (substantially a complete circle) as shown in FIG. 32A, for example. In addition, other than substantially rectangular, the shape may be substantially polygonal, for example, substantially square, substantially hexagonal, substantially octagonal or the like. Here, the angles of a polygon are not limited to any specific shape, and they may be substantially right, acute or obtuse, or they may be roundish.

Moreover, the shape of light receiver 202 and the shape of horizontal cross sections (X-Y plane) of opening portions (R1, R2) may be substantially elliptic or substantially triangular. Alternatively, their shapes may be substantially a cross or substantially a regular polygonal star formed by drawing straight lines to radiate out from the center (shapes in which multiple spokes are positioned in a radial pattern).

Figure 32B:
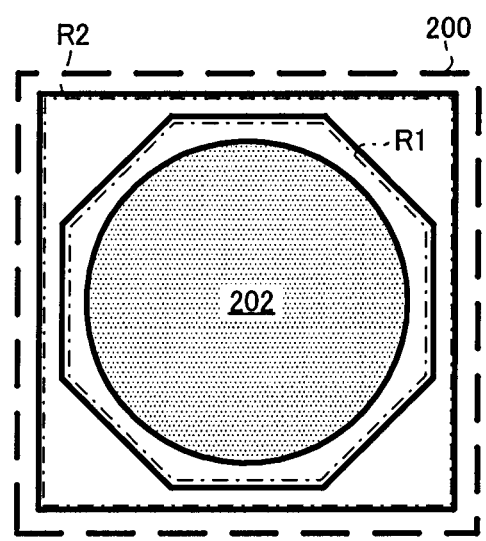
FIG. 32B is, in yet another embodiment of the present invention, a view showing an example of how a light receiver, an opening portion in the first insulation layer and an opening portion in the second insulation layer are shaped.

Alternatively, as shown in FIG. 32B, the shape of light receiver 202 and the shape of horizontal cross sections (X-Y plane) of opening portions (R1, R2) may be different from each other. In the example in FIG. 32B, light receiver 202 is shaped as substantially a complete circle, the horizontal cross section of opening portion (R1) as substantially an octagon, and the horizontal cross section of opening portion (R2) as substantially a square.

Other than the above, imaging element 200 and opening portion (RO) may be shaped freely.

Figure 33:
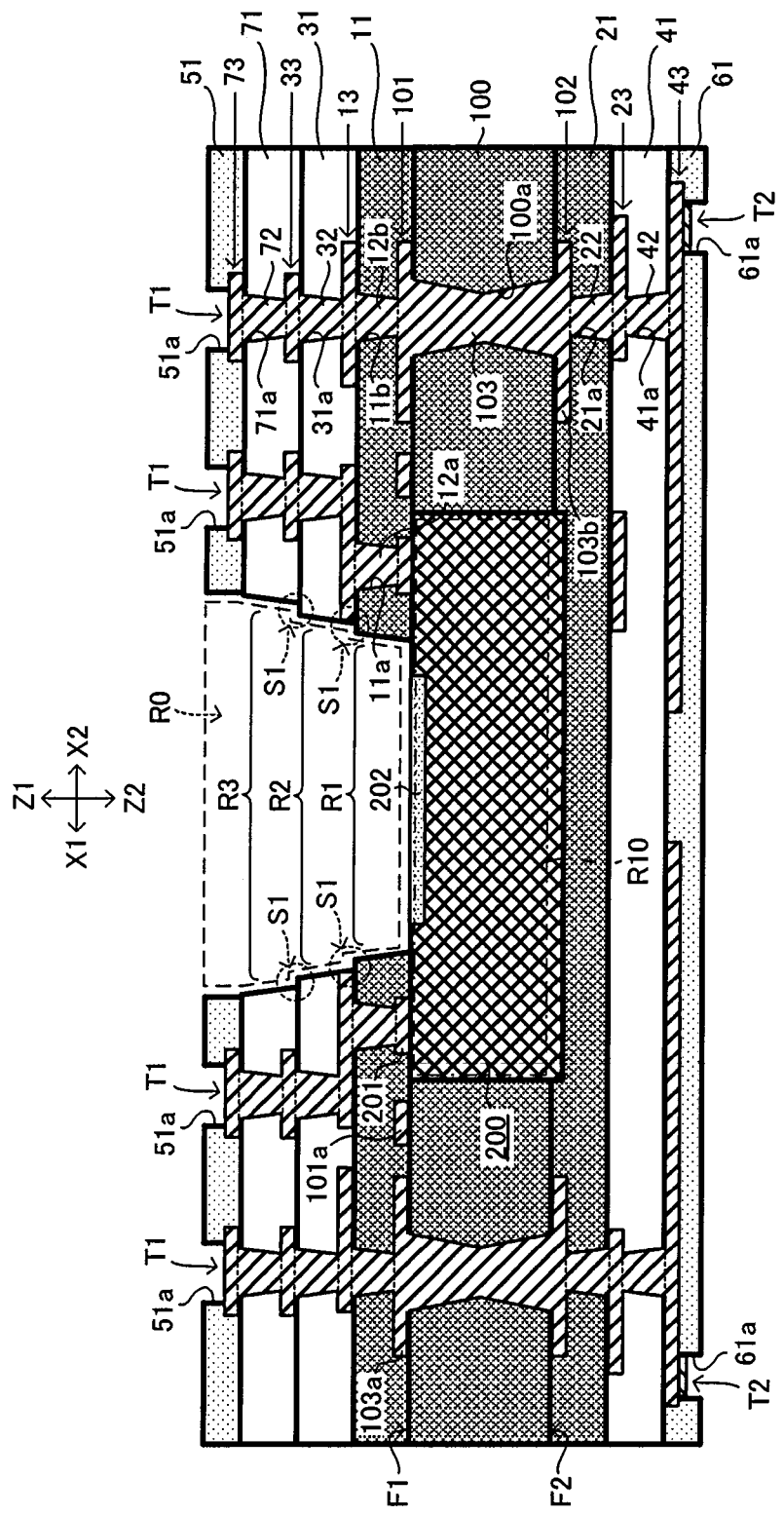
FIG. 33 is, in yet another embodiment of the present invention, a view showing an example in which a wiring board with a built-in imaging element has three or more buildup layers.

A wiring board with a built-in imaging element may have three or more buildup layers. For example, as shown in FIG. 33, it is an option that three insulation layers (11, 31, 71) and three conductive layers (13, 33, 73) are alternately laminated on the first-surface (F1) side of substrate 100, and two insulation layers (21, 41) and two conductive layers (23, 43) are alternately laminated on the second-surface (F2) side of substrate 100. In the example in FIG. 33, hole (71a) (via hole) is formed in insulation layer 71, and by filling conductor (such as copper plating) in hole (71a), the conductor in hole (71a) becomes via conductor 72 (filled conductor). Then, conductive layer 33 on insulation layer 31 and conductive layer 73 on insulation layer 71 are electrically connected to each other through via conductor 72. In addition, opening portion (R3) is formed in insulation layer 71, and opening portions (R1) through (R3) are connected. Accordingly, a hole is formed to penetrate through insulation layers (11, 31, 71) and to reach light receiver 202 of imaging element 200, and light receiver 202 is exposed through the hole.

In addition, the number of buildup layers may be different on the first-surface (F1) side of substrate 100 and on the second-surface (F2) side of substrate 100. For example, as shown in FIG. 33, three buildup layers may be formed on the first-surface (F1) side of substrate 100 and two buildup layers may be formed on the second-surface (F2) side of substrate 100. However, to mitigate stress, it is preferred to enhance the symmetry of the upper and lower surfaces by forming the same number of buildup layers on the first-surface (F1) side of substrate 100 and on the second-surface (F2) side of substrate 100. For example, FIG. 33 shows an example in which three buildup layers are formed only on one surface. However, the symmetry of the upper and lower surfaces may be enhanced by forming three buildup layers on both surfaces.

Also, step portions (S1, S2) may be formed among multiple interlayer insulation layers (see FIGS. 3A, 3B, 28B). For example, as shown in FIG. 33, step portion (S1) may be formed respectively between insulation layer 11 and insulation layer 31 as well as between insulation layer 31 and insulation layer 71.

Figure 34:
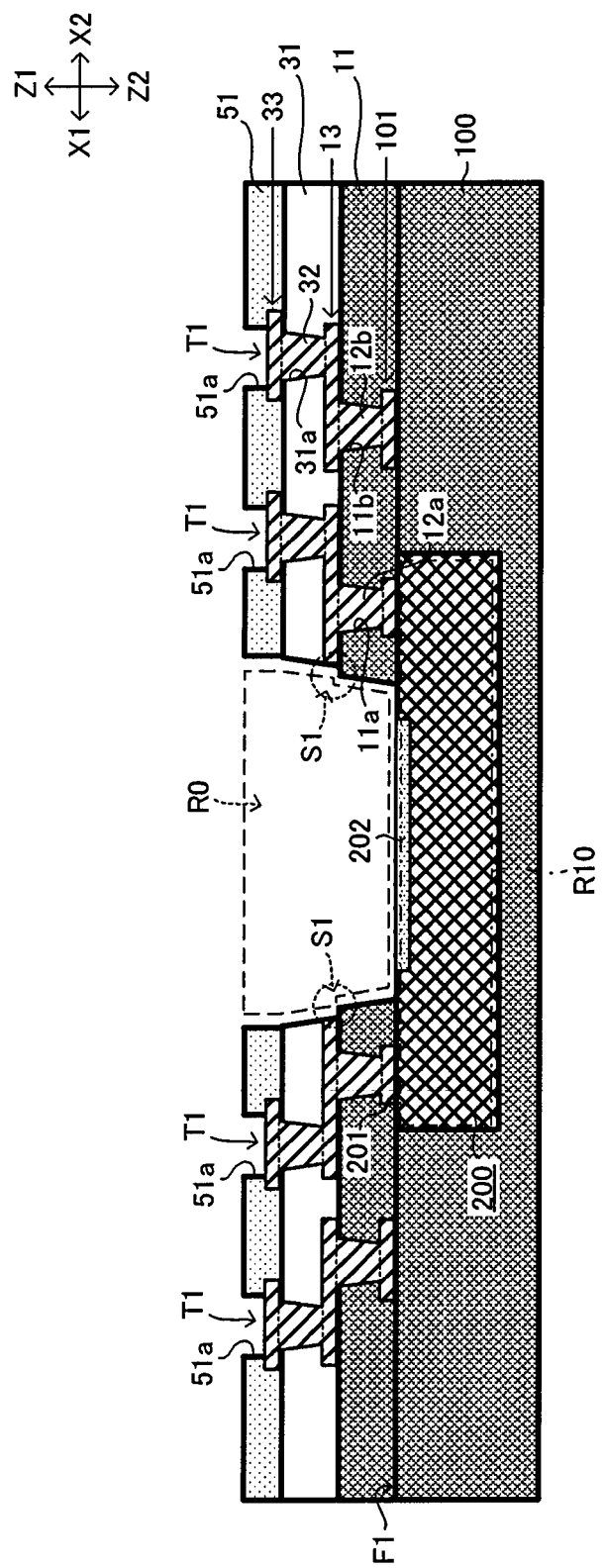
FIG. 34 is, in yet another embodiment of the present invention, a view showing an example in which a wiring board with a built-in imaging element is a single-sided wiring board.

In the above embodiments, a double-sided wiring board (wiring board 1000) was shown. However, the present invention is not limited to the above. For example, it may be a single-sided wiring board as shown in FIG. 34.

Figure 35:
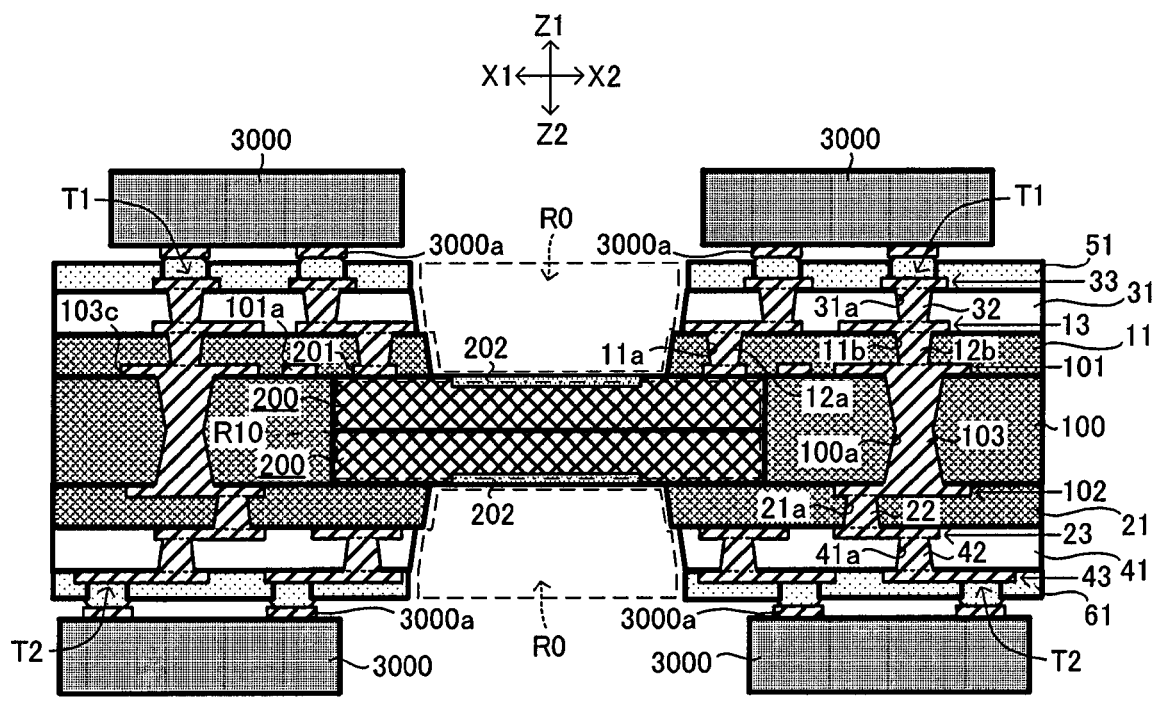
FIG. 35 is, in yet another embodiment of the present invention, a view showing an example in which a wiring board with a built-in imaging element has a sensor surface on both surfaces.

In addition, opening portion (R10) (accommodation space for imaging element 200) may be a hole that does not penetrate through substrate 100 (a recessed portion) as shown in FIG. 35, for example. In such a case, it is also preferred that the thickness of imaging element 200 and the depth of opening portion (R10) (hole) be substantially the same.

In the above embodiments, an example was shown in which the thickness of substrate 100 and the thickness of imaging element 200 are substantially the same. However, the present invention is not limited to the above. For example, as shown in FIG. 35, the thickness of substrate 100 may be greater than the thickness of imaging element 200.

The above embodiments described a wiring board with a built-in imaging element (wiring board 1000) having a sensor surface (light receiver 202) only on one surface. However, the present invention is not limited to the above. For example, as shown in FIG. 35, a wiring board with a built-in imaging element may have a sensor surface on both surfaces. In the example in FIG. 35, opening portion (RO) (opening portions R1, R2) is formed on both surfaces, and each sensor surface (light receiver 202) is exposed.

The above embodiments described a wiring board with a built-in imaging element (wiring board 1000) having only one imaging element 200 in opening portion (R0) (accommodation space for imaging element 200). However, the present invention is not limited to the above. For example, as shown in FIG. 35, a wiring board with a built-in imaging element may have multiple imaging elements 200 in opening portions (R0). In the example in FIG. 35, multiple imaging elements 200 are arrayed in lamination directions (directions Z). However, multiple imaging elements 200 may be positioned side by side in a direction X or a direction Y.

Figure 36A:
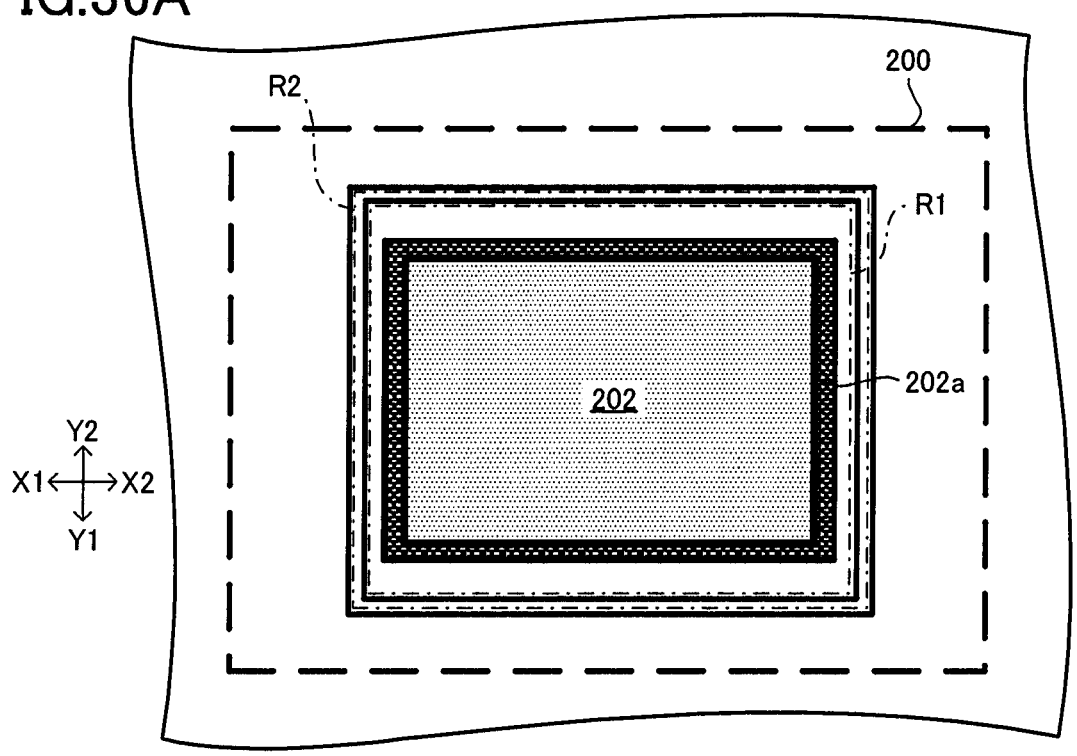
FIG. 36A is a view showing the shape of a protruding portion according to yet another embodiment of the present invention.
Figure 36B:
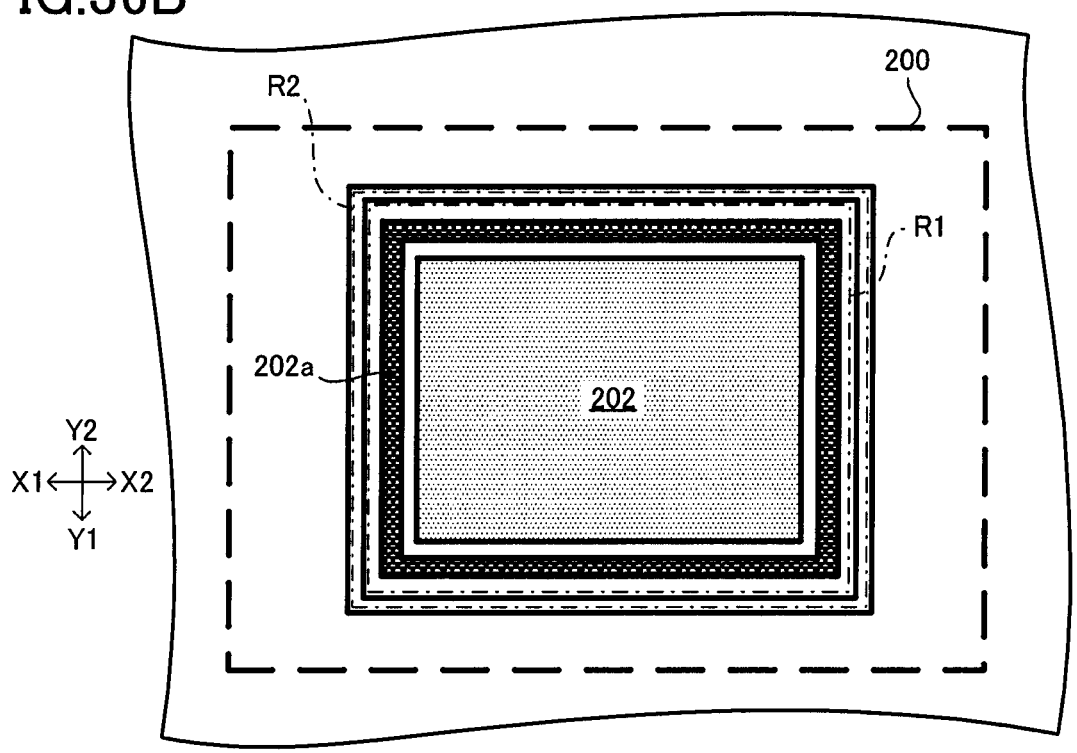
FIG. 36B is a view showing the shape of a protruding portion according to yet another embodiment of the present invention.

Protruding portion (200*a*) may be separated from insulation layer 11. As shown in FIG. 36A, for example, protruding portion (200*a*) may be separated from insulation layer 11 and be adjacent to light receiver 202. Also, as shown in FIG. 36B, for example, protruding portion (200*a*) may be separated from both insulation layer 11 and light receiver 202. If protruding portion (200*a*) is positioned between light receiver 202 and insulation layer 11, it is easier to prevent light receiver 202 from being contaminated by the contaminants from insulation layer 11.

Figure 37A:
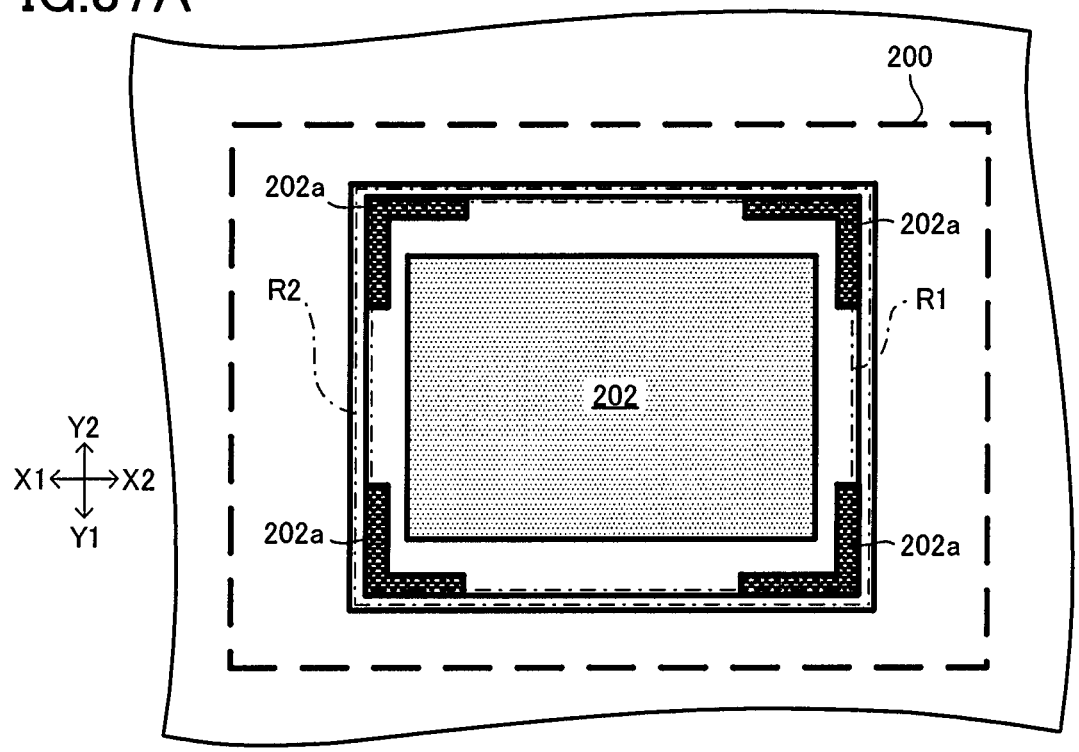
FIG. 37A is a view showing the shape of a protruding portion according to yet another embodiment of the present invention.
Figure 37B:
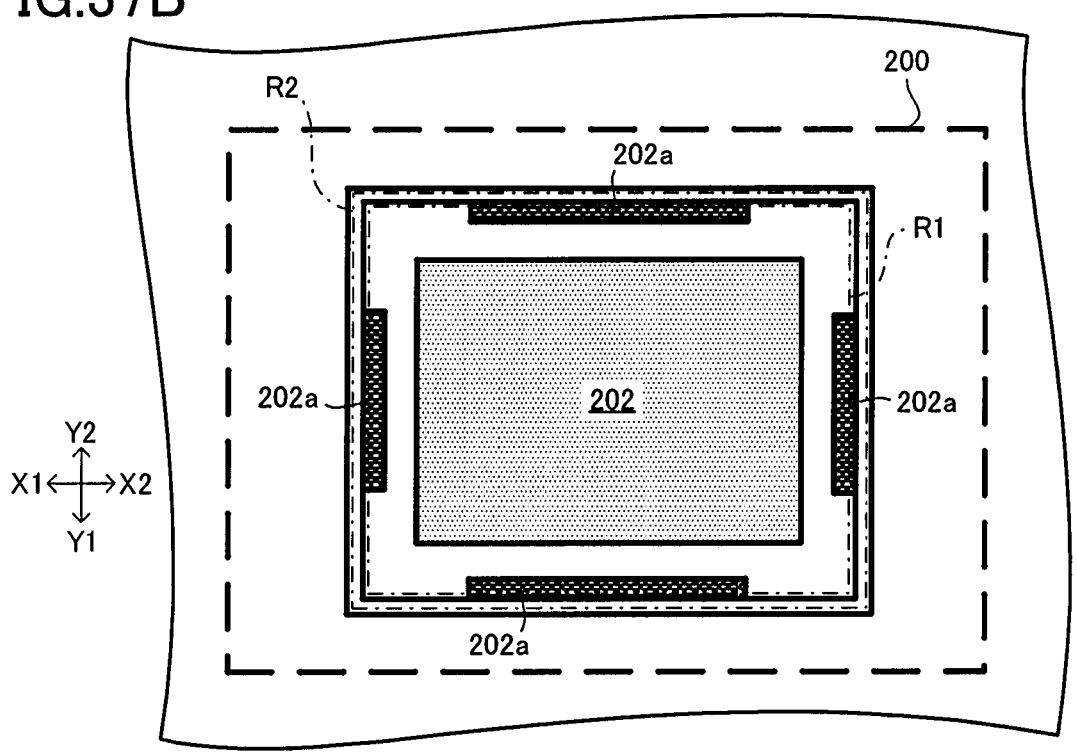
FIG. 37B is a view showing the shape of a protruding portion according to yet another embodiment of the present invention.
Figure 38A:
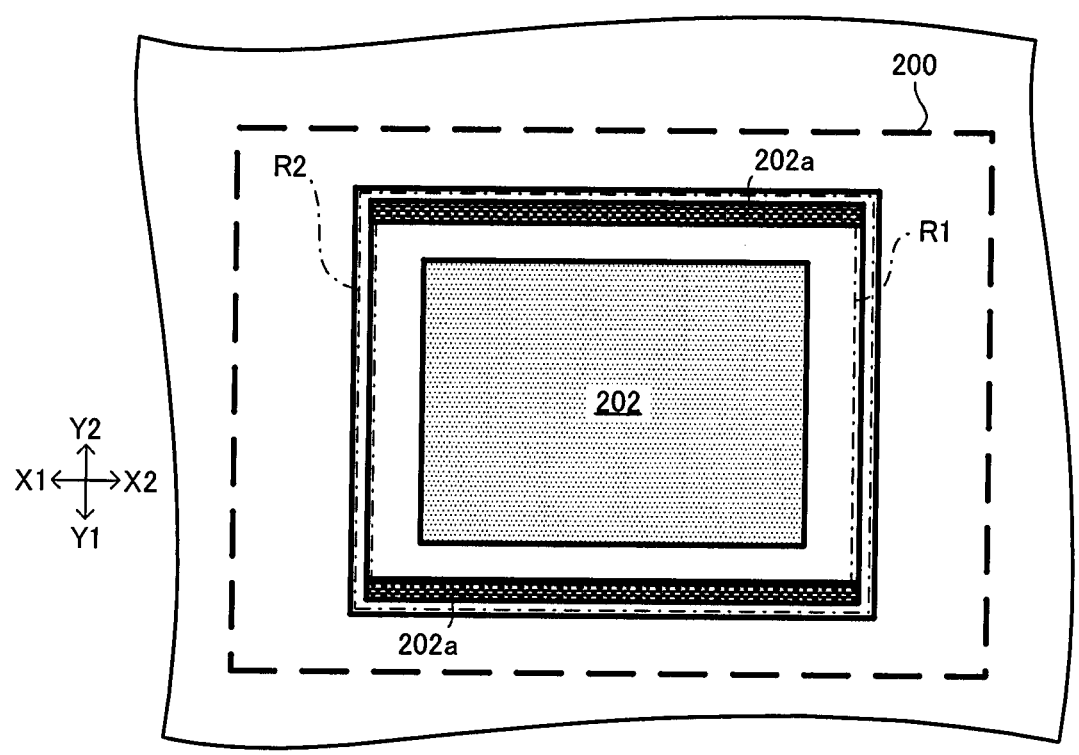
FIG. 38A is a view showing the shape of a protruding portion according to yet another embodiment of the present invention.
Figure 38B:
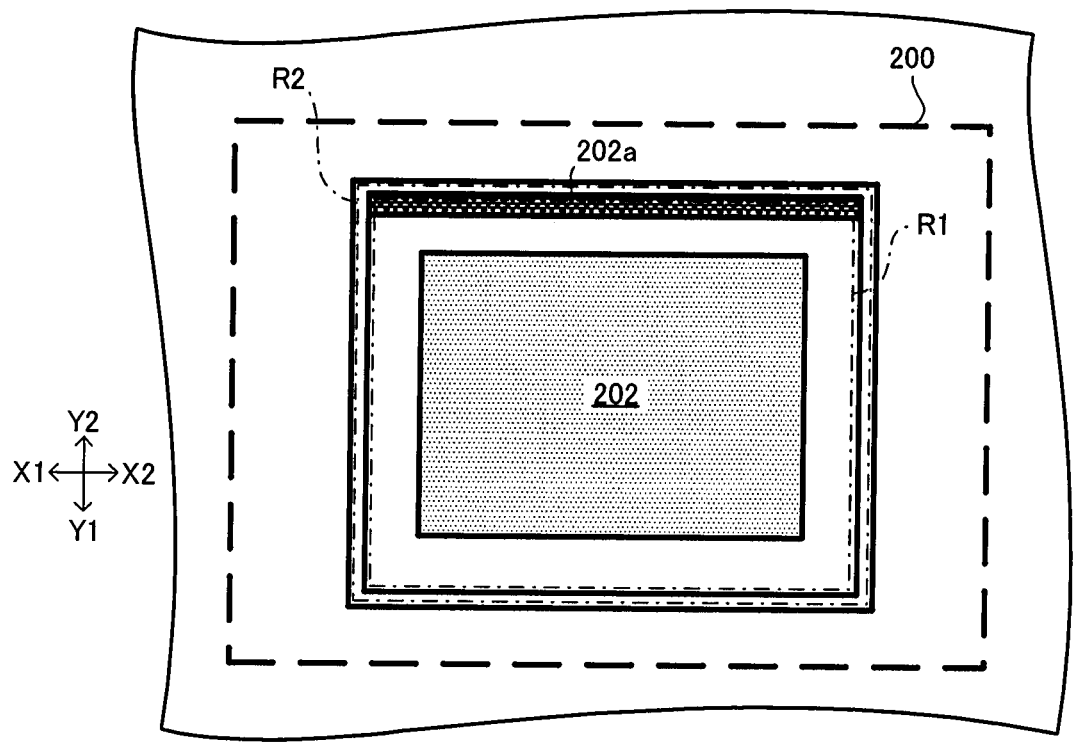
FIG. 38B is a view showing the shape of a protruding portion according to yet another embodiment of the present invention.

As shown in FIG. 37A, for example, protruding portion (200*a*) may be positioned only in four corners of light receiver 202. Alternatively, as shown in FIG. 37B, for example, protruding portion (200*a*) may be positioned only along four sides of light receiver 202. Yet alternatively, as shown in FIG. 38A, for example, protruding portion (200*a*) may be positioned only along two opposing sides of light receiver 202 to sandwich light receiver 202. Yet alternatively, as shown in FIG. 38B, for example, protruding portion (200*a*) may be positioned only along one side of light receiver 202.

Figure 39:
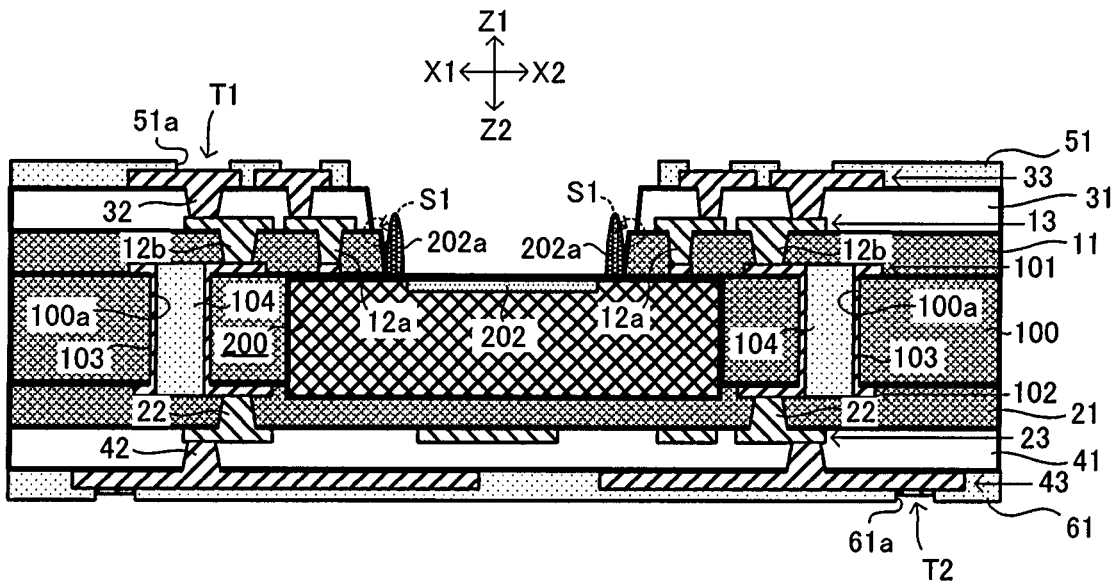
FIG. 39 is a view showing the shape of a protruding portion according to yet another embodiment of the present invention.

The height of protruding portion (200*a*) may be greater than the thickness of insulation layer 11 (first insulation layer) as shown in FIG. 39, for example. In the example in FIG. 39, the height of protruding portion (200*a*) is greater than the height of insulation layer 11 (=the thickness of insulation layer 11) and less than the height of insulation layer 31 (=the thickness of insulation layer 11+the thickness of insulation layer 31).

Figure 40:
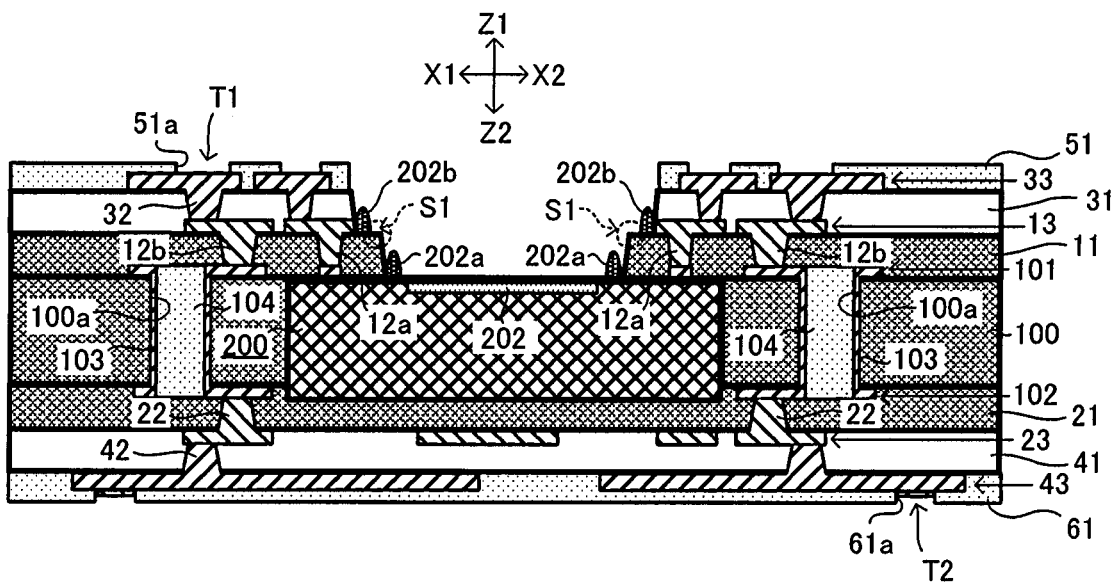
FIG. 40 is a view showing an example having a protruding portion in multiple layers in yet another embodiment of the present invention.

As shown in FIG. 40, for example, protruding portion (200*a*) may have protruding portion (202*b*) on insulation layer 11 (first insulation layer) between light receiver 202 and insulation layer 31 (second insulation layer). In such a structure, since protruding portion (202*b*) is positioned between light receiver 202 and insulation layer 31 (second insulation layer), contaminants from a processed surface of insulation layer 31 (a side surface, for example) or the like seldom reach light receiver 202. Accordingly, it is easier to prevent light receiver 202 from being contaminated. In the example in FIG. 40, protruding portion (202*b*) is adjacent to insulation layer 31. However, that is not the only option, and protruding portion (202*b*) may be separated from insulation layer 31.

Regarding other factors such as the structure of the above wiring board 1000 (wiring board with a built-in imaging element), the type of its structural elements, quality, dimensions, material, shape, number of layers, position and the like may be freely modified within a scope that does not deviate from the gist of the present invention.

For example, via conductors (12*a*, 12*b*, 22, 32, 42, 72) are not limited to being filled conductors, and they may also be conformal conductors, for example.

Also, imaging element 200 is not always required to be mounted through via connection (via conductor 12*a*), and it may be mounted by other methods such as wire bonding.

In addition, in a wiring board with a built-in imaging element according to the above embodiments, it is also an option to have a structure where among the holes formed in insulation layers (11, 31), a hole that penetrates through both insulation layers (11, 31) is the only hole for exposing light receiver 202 of imaging element 200 (opening portion R0).

Also, in a wiring board with a built-in imaging element according to the above embodiments, it is also an option to have a structure where among the holes formed in insulation layers (11, 31), the largest hole is the hole for exposing light receiver 202 of imaging element 200 (opening portion R0).

The method for manufacturing a wiring board is not limited to the order and contents shown in the above embodiments, and the order and contents may be freely modified within a scope that does not deviate from the gist of the present invention. Also, unnecessary procedures may be omitted depending on usage or the like.

Figure 41:
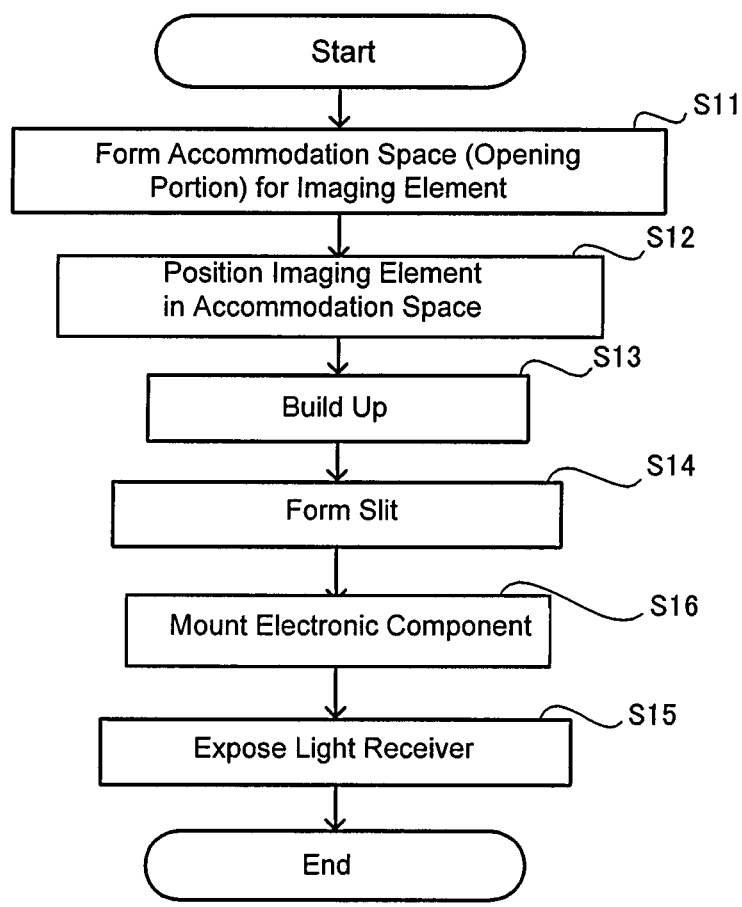
FIG. 41 is a flowchart showing a modified example of the method for manufacturing a wiring board with a built-in imaging element according to the first embodiment of the present invention.

For example, as shown in FIG. 41, it is also an option that after electronic component 3000 is mounted on a wiring board (step S16) while light receiver 202 of imaging element 200 is still covered with cover portion 110 (FIG. 12), cover portion 110 is removed to expose light receiver 202 of imaging element 200 (step S15). Light receiver 202 is less likely contaminated or damaged during the mounting process by keeping cover portion 110 when electronic component 3000 is mounted.

Figure 42:
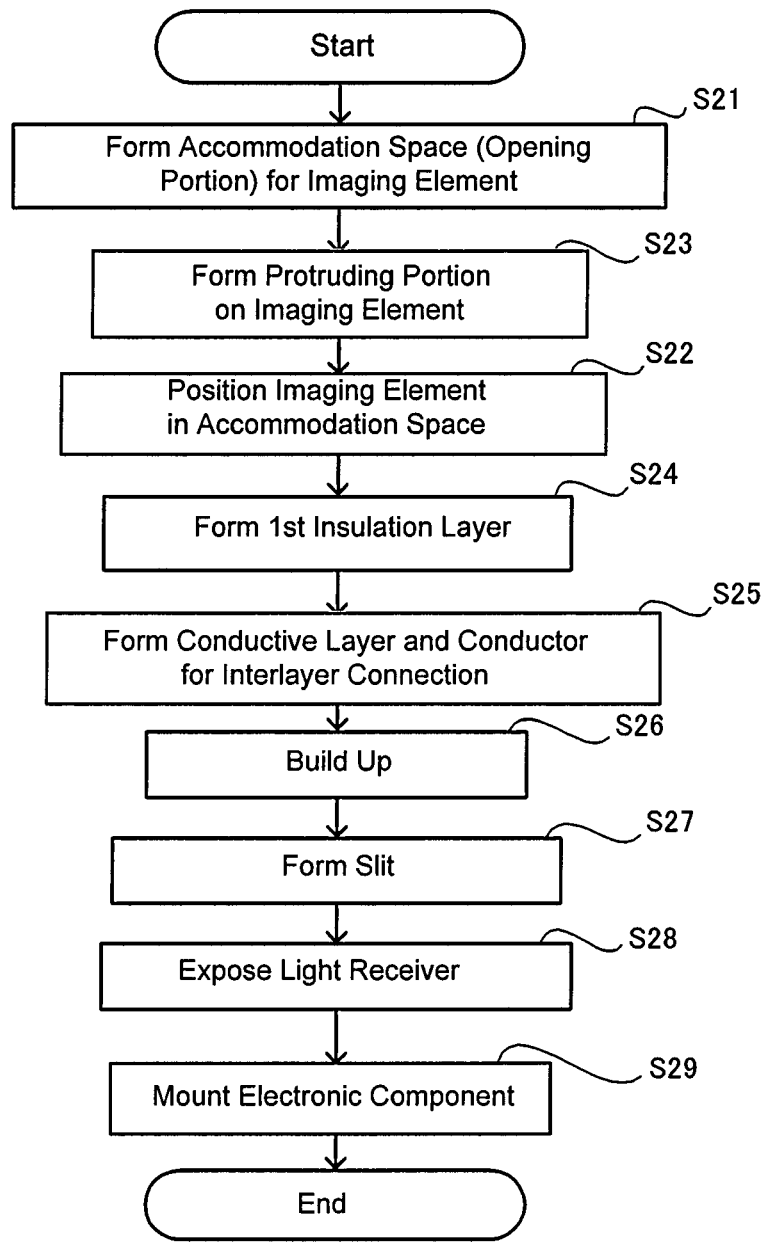
FIG. 42 is a flowchart showing a first modified example of the method for manufacturing a wiring board with a built-in imaging element according to the second embodiment of the present invention.

As shown in FIG. 42, protruding portion (200*a*) may be formed before imaging element 200 is positioned in opening portion (R10). In the manufacturing method shown in FIG. 42, forming protruding portion (200*a*) (step S23) is conducted before forming insulation layer 11 (first insulation layer) (step S24). Therefore, contaminants from a processed surface (a side surface, for example) or the like of insulation layer 11, generated while insulation layer 11 is formed and processed, are blocked by protruding portion (202*a*) and seldom reach light receiver 202. As a result, light receiver 202 is seldom contaminated.

Figure 43:
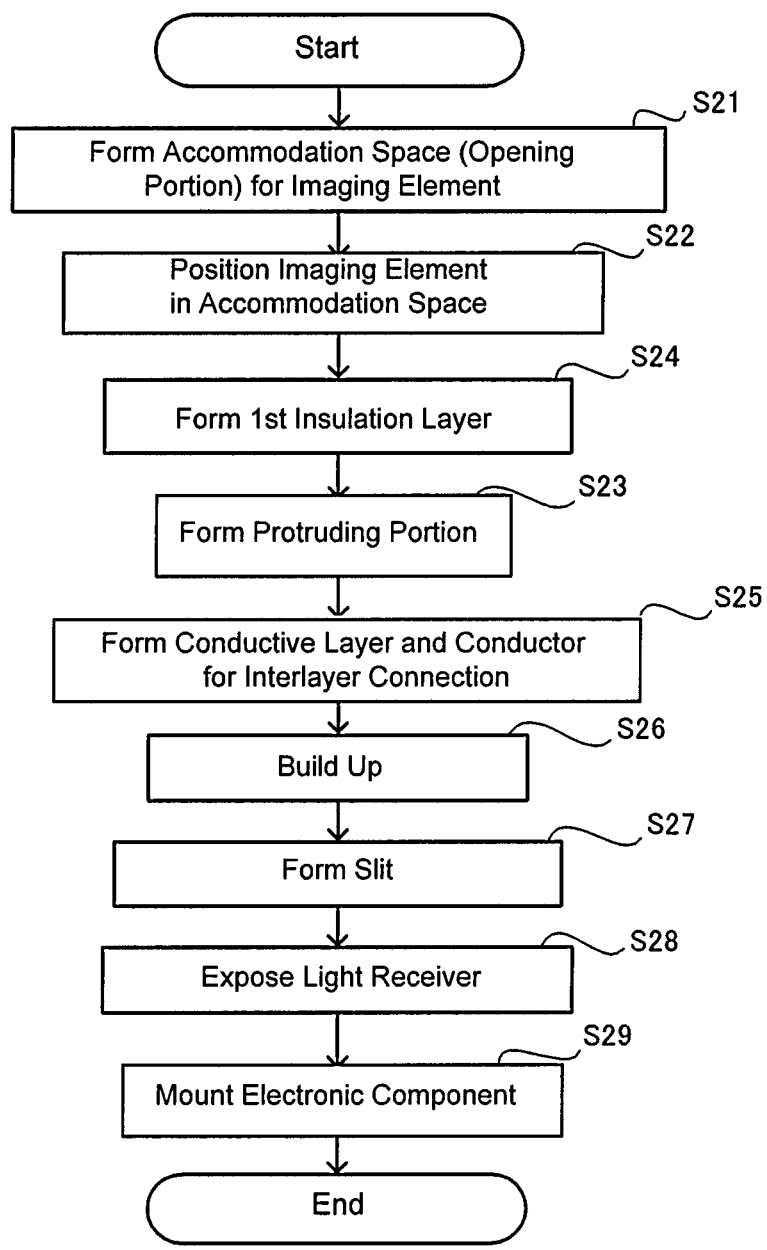
FIG. 43 is a flowchart showing a second modified example of the method for manufacturing a wiring board with a built-in imaging element according to the second embodiment of the present invention.

As shown in FIG. 43, protruding portion (202*a*) may be formed after insulation layer 11 (first insulation layer) is formed but before holes (11*a*) and the like are formed in insulation layer 11. In the manufacturing method shown in FIG. 43, forming protruding portion (202a) (step S23) is conducted before processing insulation layer 11 (first insulation layer) (step S25). Therefore, contaminants from a processed surface (a side surface, for example) or the like of insulation layer 11, generated while insulation layer 11 is processed, are blocked by protruding portion (202a) and seldom reach light receiver 202. As a result, light receiver 202 is seldom contaminated. In addition, forming protruding portion (202a) (step S23) is conducted before forming insulation layer 31 (second insulation layer) (step S26). Therefore, contaminants from a processed surface (a side surface, for example) or the like of insulation layer 31, generated while insulation layer 31 is formed and processed, are blocked by protruding portion (202a) and seldom reach light receiver 202. As a result, light receiver 202 is seldom contaminated.

Figure 44:
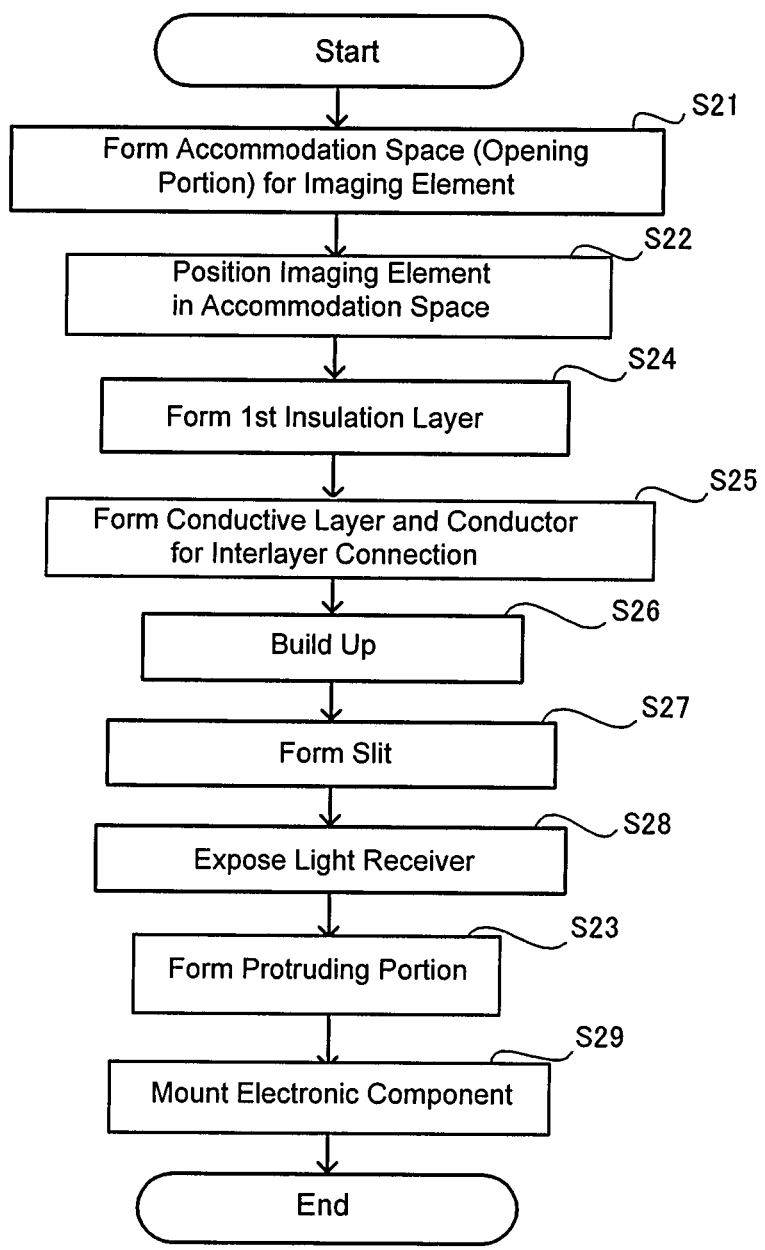
FIG. 44 is a flowchart showing a third modified example of the method for manufacturing a wiring board with a built-in imaging element according to the second embodiment of the present invention.

As shown in FIG. 44, protruding portion (202a) may be formed after light receiver 202 of imaging element 200 is exposed.

For example, the method for forming each conductive layer is not limited specifically. For example, conductive layers may be formed by any of the following methods or by combining any two or more methods: panel plating method, pattern plating method, full-additive method, semi-additive (SAP) method, subtractive method, transfer method and tenting method.

Also, instead of using a laser, wet or dry etching may be used for processing. When etching is used, it is preferred, using resist or the like, to protect in advance the portions which are not required to be removed.

The above embodiments and modified examples or the like may be combined freely. It is preferred to select an appropriate combination according to usage or the like. For example, any structure shown in FIGS. 27A~28B may be applied to any structure shown in FIGS. 29~35. Also, any structure shown in FIGS. 36A~38B may be applied to structures shown in FIGS. 39~40. Any structure shown in FIGS. 36A~38B may be applied to protruding portion (202b) (FIG. 40).

A wiring board with a built-in imaging element according to the first aspect of the present invention has the following: a substrate having a first surface, a second surface opposite the first surface and an opening portion; an imaging element positioned in the opening portion; a first insulation layer formed on the first surface of the substrate; a first conductive layer formed on the first insulation layer; a second insulation layer formed on the first conductive layer and on the first insulation layer; and a second conductive layer formed on the second insulation layer. In such a wiring board with a built-in imaging element, the first insulation layer is formed on the imaging element in such a way to expose a light receiver of the imaging element.

A method for manufacturing a wiring board with a built-in imaging element according to the second aspect of the present invention includes the following: forming an opening portion in a substrate; positioning an imaging element in the opening portion; on the substrate, forming a first insulation layer having a first opening portion; forming a first conductive layer on the first insulation layer; forming a second insulation layer on the first conductive layer and on the first insulation layer; forming a second conductive layer on the second insulation layer; and by forming in the second insulation layer a second opening portion connected to the first opening portion, exposing the light receiver of the imaging element.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board with a built-in imaging element, comprising:
    a substrate having an accommodation portion and a first surface and a second surface on an opposite side of the first surface;
    an imaging device having a light receiver and positioned in the accommodation portion of the substrate such that the light receiver faces the first surface of the substrate; and
    a buildup structure formed on the first surface of the substrate and comprising a plurality of insulation layers and a plurality of conductive layers,
    wherein the buildup structure has an opening portion formed such that the light receiver of the imaging device is exposed from the opening portion of the buildup structure, and the plurality of insulation layers in the buildup structure includes a first insulation layer formed on the first surface of the substrate.

2. The wiring board with a built-in imaging element according to claim 1, further comprising a protruding structure formed on the imaging device in the opening portion of the buildup structure such that the protruding structure is positioned between the light receiver and the first insulation layer.

3. The wiring board with a built-in imaging element according to claim 2, wherein the protruding structure is made of a photosetting resin.

4. The wiring board with a built-in imaging element according to claim 2, wherein the protruding structure is formed such that the light receiver is surrounded by the protruding structure.

5. The wiring board with a built-in imaging element according to claim 2, wherein the protruding structure is formed adjacent to the first insulation layer in the opening portion of the buildup structure.

6. The wiring board with a built-in imaging element according to claim 2, wherein the protruding structure has a height which is half or greater than half a thickness of the first insulation layer.

7. The wiring board with a built-in imaging element according to claim 2, wherein the protruding structure has a height which is the same as or greater than a thickness of the first insulation layer.

8. The wiring board with a built-in imaging element according to claim 1, further comprising a protruding structure formed on the first insulation layer such that the protruding structure is positioned between the light receiver and the second insulation layer.

9. The wiring board with a built-in imaging element according to claim 1, wherein the opening portion of the buildup structure is a hole penetrating through the buildup structure and reaching the light receiver of the imaging device.

10. The wiring board with a built-in imaging element according to claim 1, further comprising an external connection terminal configured to mount an electronic component.

11. The wiring board with a built-in imaging element according to claim 1, wherein the buildup structure has an outermost conductive layer, and the outermost conductive layer includes an external connection terminal configured to mount an electronic component.

12. The wiring board with a built-in imaging element according to claim 11, further comprising a second buildup structure formed on the second surface of the substrate, wherein the second buildup structure includes an outermost conductive layer including an external connection terminal configured to mount one of another wiring board and another electronic component.

13. The wiring board with a built-in imaging element according to claim 1, wherein the buildup structure includes a second insulation layer formed on the first insulation layer, the first insulation layer comprises a resin and a core material, and the second insulation layer comprises a resin without a core material.

14. The wiring board with a built-in imaging element according to claim 1, wherein the buildup structure includes a second insulation layer, the opening portion of the buildup structure has a first penetrating hole formed in the first insulation layer and a second penetrating hole formed in the second insulation layer and connected to the first penetrating hole, and the second penetrating hole has a width greater than a width of the first penetrating hole.

15. The wiring board with a built-in imaging element according to claim 1, wherein the buildup structure includes a first via hole structure formed in the first insulation layer and reaching to an electrode of the imaging device.

16. The wiring board with a built-in imaging element according to claim 1, wherein the buildup structure includes a first via hole structure formed in the first insulation layer and reaching to an electrode of the imaging device, the buildup structure includes a first conductive layer formed on the first insulation layer and a second insulation layer formed on the first conductive layer and the first insulation layer, the buildup structure includes a second via hole structure formed in the second insulation layer and reaching to the first conductive layer, the buildup structure includes a second conductive layer formed on the second insulation layer and including an external connection terminal, and the external connection terminal is connected to an electrode of the imaging device through the first via hole structure, the first conductive layer and the second via hole structure.

17. The wiring board with a built-in imaging element according to claim 16, wherein each of the first via hole structure and the second via hole structure comprises a conductor filling an opening for each of the first via hole structure and the second via hole structure.

18. The wiring board with a built-in imaging element according to claim 1, further comprising an insulation layer formed on the second surface of the substrate, wherein the opening portion of the buildup structure is a portion of a hole penetrating through the substrate, and the insulation layer on the second surface of the substrate is formed such that the insulation layer on the second surface of the substrate closes an opening of the hole at the second surface of the substrate.

19. The wiring board with a built-in imaging element according to claim 1, wherein the opening portion of the buildup structure is a portion of a hole penetrating through the substrate, and the substrate has a thickness which is substantially equal to a thickness of the imaging device.

20. The wiring board with a built-in imaging element according to claim 1, wherein the light receiver is positioned in a central portion of the imaging device, and the first insulation layer has an edge positioned on a periphery of the imaging device.

21. The wiring board with a built-in imaging element according to claim 1, wherein the buildup structure includes a second insulation layer formed on the first insulation layer, and the first insulation layer has a side surface positioned closer to the light receiver than a side surface of the second insulation layer.

22. The wiring board with a built-in imaging element according to claim 21, wherein the buildup structure includes a first conductive layer formed between the first insulation layer and the second insulation layer, and the first conductive layer includes a conductive pattern extending to the vicinity of the side surface of the second insulation layer.

23. A method for manufacturing a wiring board with a built-in imaging element, comprising:

forming an accommodation portion in a substrate;

positioning an imaging device in the accommodation portion of the substrate;

forming on the substrate a first insulation layer having a first opening portion such that a light receiver of the imaging device is exposed from the first opening portion;

forming a first conductive layer on the first insulation layer;

forming a second insulation layer on the first conductive layer and the first insulation layer;

forming a second conductive layer on the second insulation layer; and forming a second opening portion in the second insulation layer such that the second opening portion is connected to the first opening portion and the light receiver of the imaging device is exposed through the first opening portion and the second opening portion.

24. The method for manufacturing a wiring board with a built-in imaging element according to claim 23, wherein the forming of the second opening portion comprises irradiating laser such that the second opening portion is cut out in the second insulation layer.

25. The method for manufacturing a wiring board with a built-in imaging element according to claim 23, further comprising forming a protruding structure on the imaging device such that the protruding structure is positioned between the light receiver and the first insulation layer.

26. The method for manufacturing a wiring board with a built-in imaging element according to claim 25, wherein the protruding structure is formed before the forming of the second insulation layer.

27. The method for manufacturing a wiring board with a built-in imaging element according to claim 25, wherein the protruding structure is formed before the forming of the first insulation layer.

* * * * *